(12) United States Patent
Weigl

(10) Patent No.: US 7,936,185 B1
(45) Date of Patent: May 3, 2011

(54) CLOCKLESS RETURN TO STATE DOMINO LOGIC GATE

(75) Inventor: Daniel F. Weigl, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 12/839,630

(22) Filed: Jul. 20, 2010

(51) Int. Cl.
*H03K 19/096* (2006.01)

(52) U.S. Cl. .......................................... 326/98; 326/95

(58) Field of Classification Search .................... 326/93, 326/95–98
See application file for complete search history.

(56) References Cited

U.S. PATENT DOCUMENTS

| | | | |
|---|---|---|---|
| 5,821,775 A | 10/1998 | Mehta et al. | |
| 6,133,761 A | 10/2000 | Matsubara | |
| 6,265,900 B1 | 7/2001 | Potter | |
| 6,768,342 B2* | 7/2004 | Greenstreet et al. | 326/93 |
| 7,564,266 B2* | 7/2009 | Ge et al. | 326/95 |
| 7,746,137 B2* | 6/2010 | Saint-Laurent et al. | 327/200 |
| 2003/0141899 A1 | 7/2003 | Tzartzanis et al. | |
| 2006/0103431 A1 | 5/2006 | Ngo et al. | |

* cited by examiner

*Primary Examiner* — James Cho
(74) *Attorney, Agent, or Firm* — Gary R. Stanford; James W. Huffman

(57) ABSTRACT

A clockless return to state domino logic gate including a domino circuit and an input circuit. The domino circuit asserts s preset node and an enable node to a first logic state and asserts an output node and a reset node to a second logic state in a preset state, and switches to a latch state when the preset node is pulled to the second state. In the latch state, the domino circuit pulls the output node to the first logic state and pulls the enable node to the second logic state. The domino circuit resets back to the preset state when the first reset node is pulled to the first logic state. The input circuit controls the domino circuit based on collective state of input signals, and is configured to perform a selected logic function using at least one return to state signal without use of a clock signal.

20 Claims, 13 Drawing Sheets

CLOCKLESS RETURN TO STATE DOMINO LOGIC GATE

CROSS-REFERENCE TO RELATED APPLICATIONS

This application is related to the following co-pending U.S. Patent Applications, each of which has a common assignee and common inventors.

| SER. NO. | FILING DATE | TITLE |
|---|---|---|
| 12/839,586 (CNTR.2460) | Jul. 20, 2010 | CLOCKLESS RETURN TO STATE DOMINO LOGIC GATE |
| 12/839,586 (CNTR.2462) | Jul. 20, 2010 | CLOCKLESS RETURN TO STATE DOMINO LOGIC GATE |

BACKGROUND OF THE INVENTION

1. Field of the Invention

The present invention relates to logic circuits, and more particularly, to a self-resetting return to state (RTS) domino logic gate which operates without a clock and which is responsive to RTS signals.

2. Description of the Related Art

Logic circuits often need to be placed at random locations to perform fast logic functions on an integrated circuit (IC). In many cases, it is difficult or otherwise not practicable to route a clock signal to the circuitry performing the logic function. Most logic circuits operate with an input clock, including static and dynamic logic gates and circuits. Static CMOS gates are relatively low power but have significant input capacitance and evaluation contention between complementary P-devices and N-devices, so that static CMOS gates are relatively slow. Domino circuits are faster than corresponding static counterparts, but are almost invariably controlled by an input clock signal.

There is a need to provide a logic circuit or logic gate which performs logic functions in a fast and efficient manner without having to rely on a clock.

SUMMARY OF THE INVENTION

A clockless return to state domino logic gate according to one embodiment includes a domino circuit and an input circuit. The clockless return to state domino logic gate is responsive to input logic signals in which each input logic signal is configured to switch between first and second logic states. The domino circuit includes three inverters, first and second devices of a first conductivity type and a device of a second conductivity type. The first inverter is coupled between input and output nodes, the second inverter is coupled between the output and an enable node, and the third inverter has its input coupled to a first reset node. The first device of the first conductivity type has a control terminal coupled to the output node, a first current terminal coupled to a first source voltage node associated with the first logic state, and has a second current terminal coupled to the preset node. The first device of the second conductivity type has a first current terminal coupled to a second source voltage node associated with the second logic state, has a control terminal coupled to the enable node, and has a second current terminal coupled to the first reset node. The second device of the first conductivity type has a first current terminal coupled to the first source voltage node, has a control terminal coupled to the output of the third inverter, and has a second current terminal coupled to the preset node. The input circuit pulls the preset node to the second logic state when the input logic signals are in an evaluation state, and temporarily pulls the first reset node to the first logic state when the input logic signals transition out of an evaluation state.

In one embodiment, the input circuit includes an evaluation circuit, an enable circuit and a reset circuit. The evaluation circuit pulls the preset node to the second logic state when the input logic signals are in an evaluation state. The enable circuit pulls a second reset node to the first logic state when the enable node is in the second logic state. The reset circuit couples the first reset node to the second reset node when the input logic signals are not an evaluation state. In one embodiment, the first source voltage node has a positive source voltage, the second source voltage node has a reference voltage, the first conductivity type is P-type, and the second conductivity type is N-type. In an alternative embodiment, the first source voltage node has a reference voltage, the second source voltage node has a positive source voltage, the first conductivity type is N-type, and the second conductivity type is P-type. The input signals may include at least one return to state (RTS) signal, which may either be return to one (RT1) or return to zero (RT0) depending upon the particular configuration.

An integrated circuit according to one embodiment includes at least one clockless return to state domino logic gate and a first circuit. The first circuit provides at least one RTS signal, in which it asserts each RTS signal to the second state after being asserted to the first state according to return to state operation. The clockless return to state domino logic gate may be configured in a similar manner as previously described.

A method of evaluating multiple input logic signals, which include at least one RTS input signal, includes setting a preset node to a first logic state which is inverted relative to a second logic state, inverting the preset node to determine a logic state of an output node, inverting the output node to determine a logic state of an enable node, pulling a reset node to the second logic state when the enable node is at the first logic state, inverting the reset node to determine a logic state of an inverted reset node, pulling the preset node to the first logic state when the inverted reset node is at the second logic state, forcing the preset node to the second logic state only when the input signals are in an evaluation state, providing at least one RTS input signal which returns to the second logic state after transitioning to the first logic state, and forcing the reset node to the first logic state when the enable node is in the second logic state and when the input signals transition out of an evaluation state in accordance with return to state operation. Further, when the reset node is forced to the first logic state, the inverted reset node transitions to the second logic state, which then transitions the preset node back to the first logic state, which then transitions the output node back to the second logic state, which then transitions the enable node back to the first logic state, which then transitions the reset node back to the second logic state, and which then transitions the inverted reset node back to the first logic state.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed. The present inventor has observed that it is desired to perform logic functions in a fast and efficient manner without having to rely on a clock signal. The present inventor has therefore developed a clockless return to state domino logic gate, as will be further described below with respect to FIGS. 1-17.

Figure 1:
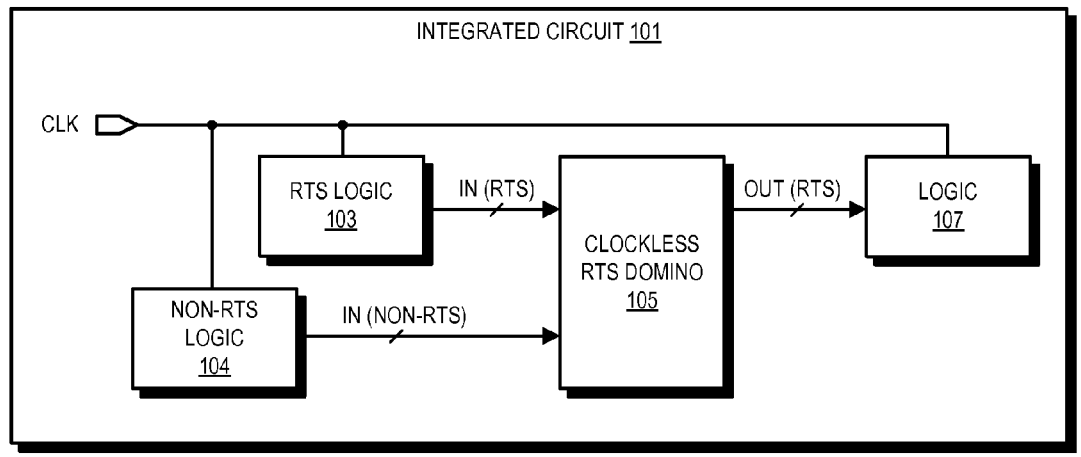
FIG. 1 is a simplified block diagram of a chip or integrated circuit (IC) including a clockless return to state (RTS) domino circuit implemented according to one embodiment.

FIG. 1 is a simplified block diagram of a chip or integrated circuit (IC) 101 including a clockless return to state (RTS) domino circuit 105 implemented according to one embodiment. The IC 101 is of any type and incorporates any number of electronic circuits as known to those skilled in the art. In one embodiment, the IC 101 is a processor such as a microcontroller or a microprocessor or the like, although any type of IC or chip is contemplated. A clock signal CLK is routed on the IC 101 to RTS logic 103, which outputs one or more RTS input signals IN on corresponding input nodes coupled to corresponding inputs of the clockless RTS domino circuit 105. The CLK signal is also routed to NON-RTS logic 104, which outputs one or more non-RTS IN signals on corresponding input nodes coupled to corresponding inputs of the clockless RTS domino circuit 105. As further described below, the IN signals may include any combination of RTS and non-RTS signals depending upon the configuration of the clockless RTS domino circuit 105. In certain implementations (e.g., dual configurations), each of the IN signals is an RTS signal (e.g., an OR gate configuration) and in other configurations (e.g., non-dual configurations), at least one of the IN signals is RTS whereas each of the remaining IN signals is RTS or non-RTS. In general, RTS signals are developed and provided where needed as further described below. The clockless RTS domino circuit 105 outputs one or more RTS output signals OUT to corresponding inputs of another logic circuit 107, and the CLK signal is also routed to clock inputs of the logic circuit 107. The RTS logic 103 includes any combination of static or dynamic circuitry further including any combination of latch or register circuits for developing the IN signals according to RTS operation. The logic 107 includes any combination of static circuits or domino circuits (footed or footless) and/or any combination of latches or registers for receiving or otherwise latching or registering the OUT signals.

Each IN and OUT signal is an RTS signal meaning that it returns to a predetermined default or first state after switching to a second state. In binary logic, RTS is either return to zero (RT0) in which the default logic state is logic one (0), or return to one (RT1) in which the default logic state is logic one (1). The clockless RTS domino circuit 105 includes one or more clockless RTS domino gates that are cascaded or coupled together according to any combination of series and parallel coupling configuration. Any number of clockless RTS domino gates may be cascaded or coupled in series limited only by applicable timing constraints which determine when corresponding output signals need to be valid. Each clockless RTS domino gate receives any number of RTS input signals and outputs at least one RTS output signal to other circuitry, including another clockless RTS domino gate or the logic circuit 107 or the like.

Figure 2:
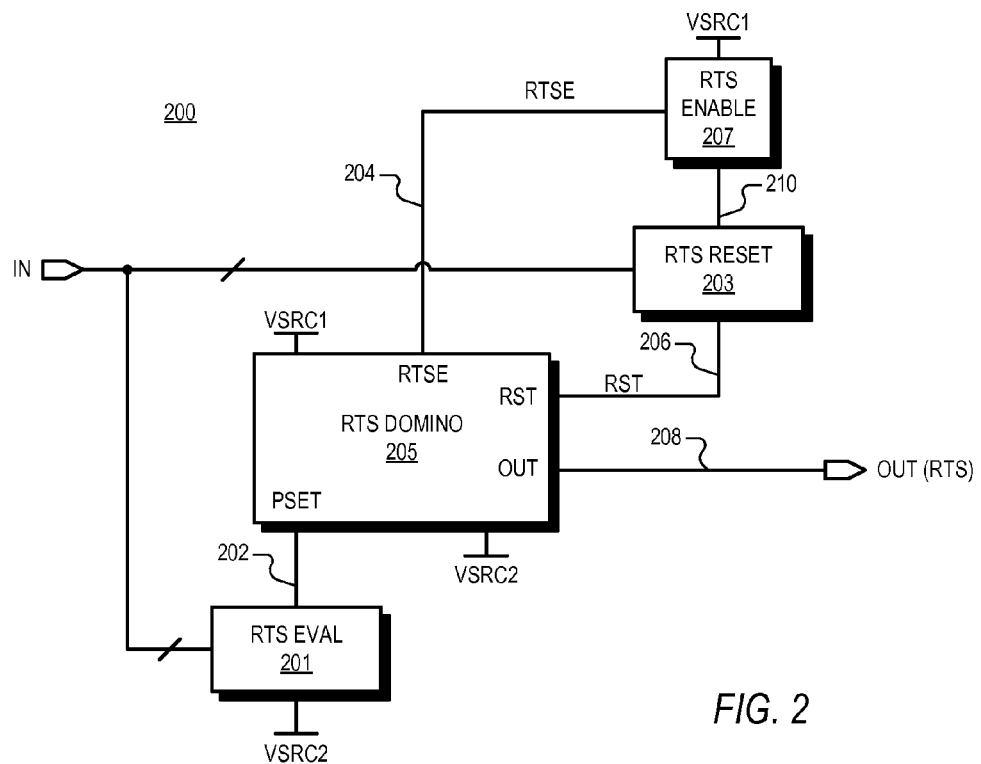
FIG. 2 is a block diagram of a clockless RTS domino gate implemented according to one embodiment which may be used as any one or more of the clockless RTS domino gates of the clockless RTS domino circuit of FIG. 1.

FIG. 2 is a block diagram of a clockless RTS domino gate 200 implemented according to one embodiment which may be used as any one or more of the clockless RTS domino gates of the clockless RTS domino circuit 105. One or more of the IN signals are provided on corresponding input nodes to corresponding inputs of an RTS evaluation circuit 201 and at least one of the IN signals is provided to an RTS reset circuit 203. Although the same input signals IN are shown provided to both circuit 201 and 203, in certain embodiments, as described further below, a subset of the input signals IN may be provided to the RTS reset circuit 203. Also, the IN signals may be RTS or may include one or more non-RTS signals. The clockless RTS domino gate 200 further includes an RTS domino circuit 205 which is coupled to a pair of source voltages VSRC1 and VSRC2. The source voltages VSRC1 and VSRC2 are each provided by a power circuit (not shown) and have suitable voltage levels for collectively providing source voltage to electronic circuits on the IC 101 as understood by those skilled in the art. The particular voltage level of each source voltage and the corresponding voltage range between the source voltages VSRC1 and VSRC2 depends upon the type of circuitry and the particular technology or process used, such as 5 Volts (V), 3.3V, 2.1V, etc. Usually, one of the source voltages VSRC1 and VSRC2 is a reference voltage (e.g., VSS) and the other is a source voltage (e.g., VDD) as understood by those skilled in the art. The RTS evaluation circuit 201, the RTS reset circuit 203 and the RTS enable circuit 207 may collectively form an input circuit responsive to the IN signals.

The RTS evaluation circuit 201 is coupled to VSRC2 and to a preset node 202, which is further coupled to a preset (PSET) input/output (I/O) of the RTS domino circuit 205. The RTS domino circuit 205 has an output providing an RTS output signal OUT on an output node 208, a reset (RST) I/O developing a reset signal RST on a reset node 206, and an RTS enable output RTSE providing an RTS enable signal RTSE on a corresponding RTS enable node 204. The clockless RTS domino gate 200 includes an RTS enable circuit 207 coupled to VSRC1, having an input coupled to node 204 for receiving the RTSE signal, and having another terminal coupled to a secondary reset node 210. The RTS reset circuit 203 is coupled between reset nodes 210 and 206.

Each of the signal nodes (e.g., IN, OUT, PSET, RST, RTSE, etc.) has a first logic state which is associated with the voltage level of VSRC2 and a second logic state which is associated with the voltage level of VSRC1. The RTS evaluation circuit 201 has an initial default state when each of the IN signals are in the first logic state, which is the same as their return state. The RTS evaluation circuit 201 enters an evaluation state causing an evaluation event when the IN signals collectively transition to any one of one or more evaluation states. The one or more evaluation states of the IN signals which cause the evaluation event depends upon the particular logic configuration of the RTS evaluation circuit 201. As an example, if the RTS evaluation circuit 201 is configured as an OR gate, then an evaluation event occurs when any one or more of the IN signals transitions from the first logic state to the second logic state. On the other hand, if the RTS evaluation circuit 201 is configured as an AND gate, then an evaluation event occurs only when each of the IN signals transitions from the first logic state to the second logic state. The RTS domino circuit 205 generally has two states, including a "preset" state which is its initial or default state, and a "latch" state. In its preset state, the RTS domino circuit 205 "presets" its PSET I/O, and thus node 202, to the second logic state. Also in the preset state, the RTS domino circuit 205 initially asserts RST to the first logic state and RTSE to the second logic state. The RTS reset circuit 203 has an isolation state and a reset state depending upon the states of those IN signals provided to it. When each of the IN signals provided to the RTS reset circuit 203 is in or otherwise returns to the first logic state, the RTS reset circuit 203 is in its reset state. Otherwise, the RTS reset circuit 203 is in its isolation state. It is noted that whenever the collective state of the IN signals corresponds with any one of the one or more evaluation states, the RTS reset circuit 203 is in its isolation state. The RTS enable circuit 207 has in initial default state when RTSE is in the second logic state and transitions to an enable state when RSTE is in the first logic state.

Operation of the clockless RTS domino gate 200 is as follows. An evaluation event occurs when the IN signals transition to any one of one or more evaluation states which cause the RTS evaluation circuit 201 to enter its evaluation state and which causes the RTS reset circuit 203 to enter its isolation state. In its evaluation state, the RTS evaluation circuit 201 pulls node 202 and thus the PSET I/O of the RTS domino circuit 205 to the first logic state, which causes the RTS domino circuit 205 to switch from its preset state to its latch state. When the RTS domino circuit 205 switches to its latch state, it switches OUT to the second logic state, it switches RTSE to the first logic state, and it no longer drives RST. The RTS enable circuit 207 enters its enable state coupling node 210 to VSRC1 in response to RTSE being in the first logic state. Since the RTS reset circuit 203 is in its isolation state in response to the IN signals, it also does not drive the RST signal even though the RTS enable circuit 207 is enabled. Nonetheless, the RST signal remains in the first logic state.

When the RTS IN signals which are provided to the RTS reset circuit 203 return back to their default state according to RTS operation, the RTS reset circuit 203 enters its reset state in which it couples the reset nodes 210 and 206 together pulling RST to the second logic state through circuits 203 and 207. RST being pulled to the second logic state causes a reset event in which the RTS domino circuit 205 returns to its preset state. In particular, the RTS domino circuit 205 pulls its PSET I/O, and thus node 202, back to it's the second logic state, it switches OUT back to the first logic state, and it switches RTSE back to the second logic state. The RTS enable circuit 207 is effectively turned off in response to RTSE switching back to the second logic state, and the RTS domino circuit 205 pulls RST back to the first logic state.

In summary, when the input signals IN collectively transition to any one of one or more evaluation states, the RTS evaluation circuit 201 transitions to an evaluation state causing an evaluation event and the RTS reset circuit 203 enters an isolation state. In response to the evaluation event, the RTS domino circuit 205 transitions from its preset state to its latch state, switching OUT and RTSE thus enabling the RTS enable circuit 207. When each RTS IN signal, or at least those RTS IN signals provided to the RTS reset circuit 203, return to the first logic state in accordance with RTS operation, the RTS evaluation circuit 201 returns to its default state and the RTS reset circuit 203 enters its reset state pulling RST to the second logic state causing a reset event. In response to the reset event, the RTS domino circuit 205 returns to its preset state pulling RTSE back to the second logic state disabling the RTS enable circuit 207. Once the RTS enable circuit 207 is disabled, that state of the RTS reset circuit 203 is inconsequential to operation until after another evaluation event. The RTS domino circuit 205 subsequently pulls RST back to the first logic state and the clockless RTS domino gate 200 is ready for the next evaluation event. In this manner, the clockless RTS domino gate 200 is a self-resetting circuit which operates to evaluate a logic condition without a clock signal.

As further described below, the clockless RTS domino gate 200 may be configured as an RT0 logic gate responsive to RT0 input signals or an RT1 logic gate responsive to RT1 input signals. In some embodiments, the RTS evaluation circuit 201 and the RTS reset circuit 203 are dual configurations responsive to the same RTS IN signals. In certain of these embodiments (e.g., shown in FIGS. 10 and 17), the RTS reset circuit 203 is simplified in which selected ones of the RTS IN signals are provided to the RTS reset circuit 203 when the same logic function may be achieved with the selected subset of the RST IN signals. In other embodiments, the circuits 201 and 203 are not dual configurations and only a subset of the IN signals are provided to the RTS reset circuit 203. The IN signals provided to the RTS reset circuit 203 are RTS signals, whereas the remaining IN signals may be RTS or non-RTS. For any of these embodiments, the reset state is false when the evaluation state is true. The evaluation state goes false when the evaluation conditions of the RTS evaluation circuit are no longer met, and the reset state goes true after the evaluation goes false and when the reset conditions of the RTS reset circuit are met.

Figure 3:
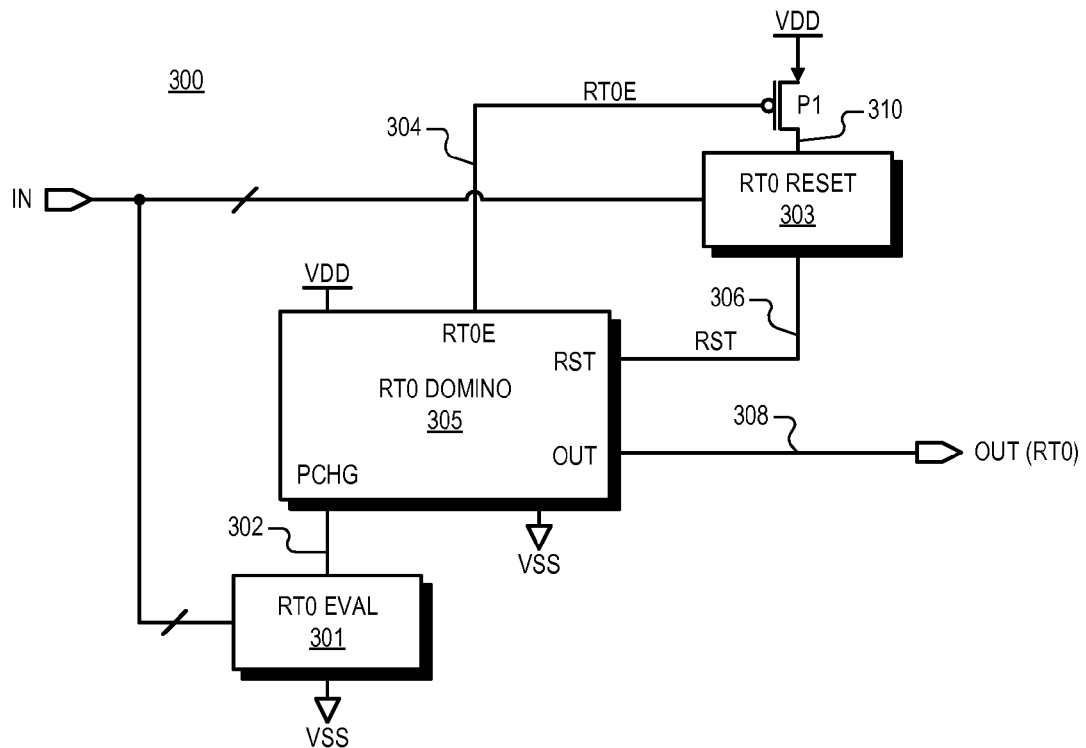
FIG. 3 is a schematic and block diagram of a clockless return to zero (RT0) domino gate implemented according to one RT0 embodiment of the clockless RTS domino gate of FIG. 2.

FIG. 3 is a schematic and block diagram of a clockless RT0 domino gate 300 implemented according to one RT0 embodiment of the clockless RTS domino gate 200. The OUT signal and at least one IN signal are configured as RT0 signals having a default logic state of logic 0. VSRC1 is configured as a source voltage VDD and VSRC2 is configured as a reference voltage VSS as understood by those skilled in the art. The RTS evaluation circuit 201, the RTS domino circuit 205 and the RTS reset circuit 203 are implemented by an RT0 evaluation circuit 301, an RT0 domino circuit 305 and an RT0 reset circuit 303, respectively, which are configured according to RT0 operation. It is noted that although either one of the individual circuits 301 and 303 may, in isolation, appear as an RT1 circuit from the perspective of its output, each is referred to as RT0 from the perspective of the inputs and the overall functionality of the RT0 domino gate 300. The PSET I/O is implemented as a pre-charge (PCHG) I/O which is coupled to a pre-charge node 302 implementing the preset node 202. The output of the clockless RT0 domino gate 300 asserts an RT0 output signal OUT on output node 308, and the reset signal RST is developed on reset node 306. The RTSE node 204 is implemented as an RT0E node 304 which is coupled to the gate of a P-channel device P1, which implements the RTS enable circuit 207. The source of P1 is coupled to VDD and its drain is coupled to the RT0 reset circuit 303 via secondary reset node 310, and the RT0 reset circuit 303 is further coupled to the reset node 306.

Figure 4:
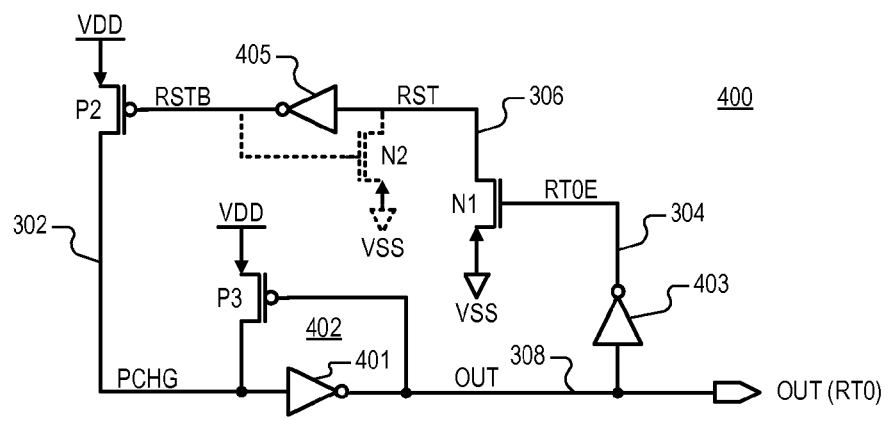
FIG. 4 is a schematic diagram of an RT0 domino circuit illustrating one embodiment of the RT0 domino circuit of FIG. 3.

FIG. 4 is a schematic diagram of an RT0 domino circuit 400 illustrating one embodiment of the RT0 domino circuit 305. The PCHG node 302 is coupled to the input of an inverter 401 and to the drains of P-channel devices P2 and P3. The output of the inverter 401 is coupled to the output node 308 developing the RT0 output signal, to the gate of P3 and to the input of another inverter 403. The output of the inverter 403 is coupled to node 304 developing the RT0E signal which is provided to the gate of an N-channel device N1. The source of N1 is coupled to VSS and its drain is coupled to the reset node 306 developing the reset signal RST. RST is provided to the input of an inverter 405, which has an output developing an inverted reset signal RSTB. RSTB is provided to the gate of P2, having its source coupled to VDD. The inverter 401 and P3 collectively form a half-keeper circuit 402 which keeps PCHG high unless pulled low by the RT0 evaluation circuit 301. PCHG is initially pre-charged high, so that the inverter 401 asserts OUT low turning on P3. P3 pulls PCHG to VDD and thus maintains PCHG at a high logic state. Since OUT is initially low, the inverter 403 asserts RT0E high turning on N1, and N1, when turned on, pulls RST low. The inverter 405 thus pulls RSTB high and P2 is off.

Referring to FIGS. 3 and 4, in response to an evaluation event when one or more of the IN signals transition to any one of one or more evaluation states, the RT0 evaluation circuit 301 pulls PCHG low to cause the RT0 domino circuit 400 to transition to its latch state. In particular, the inverter 401 pulls OUT high turning P3 off. The inverter 403 pulls RT0E low turning on P1 and turning off N1. P1 is enabled to couple node 310 to VDD. N1 is turned off so that it no longer drives RST low. The evaluation state of the IN signals cause the RT0 reset circuit 303 to transition to its isolation state so that it isolates node 306 from 310. In this manner, reset node 306 is temporarily isolated so that RST is not driven to any particular state. Nonetheless, RST stays low since not driven high by any other device. In an alternative embodiment, another N-channel device N2 is provided (shown with dashed lines) to form a half-keeper circuit with the inverter 405 to keep RST low. N2 has its gate receiving RSTB, its drain coupled to node 306 and its source coupled to VSS. Since RSTB is initially high, N2 keeps node 306 low when N1 is turned off. N2 is provided if it is desired to ensure or otherwise guarantee that RST remains low in this condition. While the IN signals are in an evaluation state, the RT0 reset circuit 303 remains in its isolation state.

When each of the RT0 IN signals that are provided to the RT0 reset circuit 303 return back to its default state, the RT0 reset circuit 303 transitions to its reset state causing a reset event in which P1 and the RT0 reset circuit 303 collectively pull RST high. It is noted that if N2 is provided, the RT0 reset circuit 303 is designed to overcome N2 to pull RST high. The inverter 405 responds by pulling RSTB low turning on P2. P2, when turned on, pulls PCHG back high to its default state. Note that when each of the RT0 IN signals provided to the RT0 reset circuit 303 return back to its default state, the IN signals are no longer in an evaluation state so that the RT0 evaluation circuit 301 no longer pulls PCHG low. In this manner, P2 pulls PCHG back high again to its precharge state. When PCHG goes high, the inverter 401 asserts OUT low again turning on P3 to keep PCHG high. The inverter 303 pulls RT0E high turning on N1 and turning off P1. Since P1 is turned off, the RT0 reset circuit 303 is isolated from VDD and can no longer pull RST high. Furthermore, N1 turns on pulling RST back low and the inverter 405 pulls RSTB high to turn off P2 (and to turn N2 back on if provided). Although P2 turns off, the half-keeper circuit 402 keeps PCHG high. In this manner, the RT0 domino circuit 400 resets back to its preset state in preparation for the next evaluation event.

Figure 5:
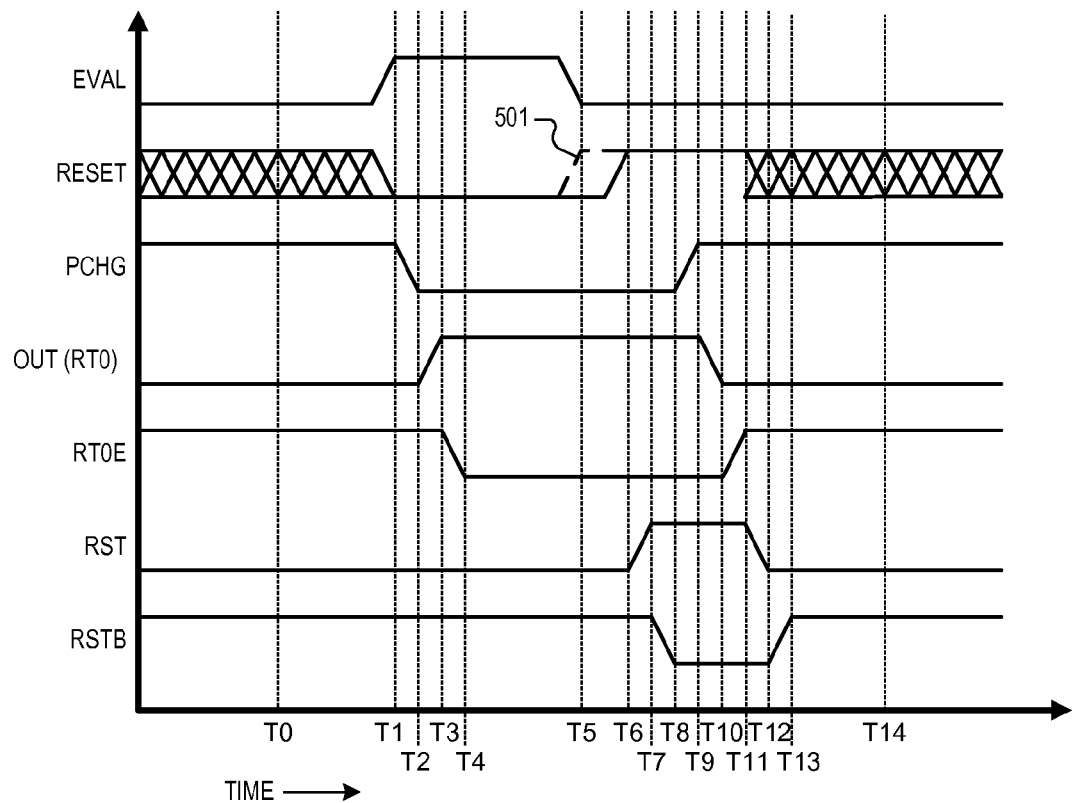
FIG. 5 is a timing diagram illustrating operation of the clockless RT0 domino gate of FIG. 3 using the RT0 domino circuit of FIG. 4 according to one embodiment.

FIG. 5 is a timing diagram illustrating operation of the clockless RT0 domino gate 300 using the RT0 domino circuit 400 as the RT0 domino circuit 305 according to one embodiment. A first state signal EVAL represents an evaluation state of the RT0 evaluation circuit 301 causing an evaluation event. EVAL is high when the evaluation state is true and is low when the evaluation state is false. The number of evaluation states of the IN signals depends upon the particular logic function of the RT0 domino circuit 305. For example, if the RT0 domino circuit 305 is configured for a logic OR function, then an evaluation state occurs for any combination of the IN signals when any one or more of the IN signals is high. If the RT0 domino circuit 305 is configured for a logic AND function, then there is only one evaluation state of the IN signals when each IN signal is high. A second state signal RESET represents a reset state of the RT0 reset circuit 303 in which RESET is high when the reset state is true and is low when the reset state is false. The reset state depends on the configuration of the RT0 reset circuit 303 and the state of the IN signals provided to the RT0 reset circuit 303. Whenever the IN signals are in any one of the one or more evaluation states, then the reset state is false and the RT0 reset circuit 303 is in its isolation state. Whenever each of the RT0 IN signals provided to the RT0 reset circuit 303 returns to zero, then the RT0 reset circuit 303 is in its reset state. A reset event occurs only when RT0E is low turning on P1 and the RT0 reset circuit 303 is in its reset state. A few generalizations apply depending upon the relative configuration of the evaluation and reset circuits. For both dual and non-dual configurations, when all of the IN signals return to zero, the reset state is true and the evaluation state is false. For both dual and non-dual configurations, when the evaluation state is true, the reset state is false. For non-dual configurations, only a subset of the IN signals are provided to the RT0 reset circuit 303 so that the reset state may go false while the evaluation state is false and the reset state may remain false after the evaluation state goes false.

As shown in FIG. 5, the EVAL, RESET, PCHG, OUT, RT0E, RST and RSTB signals are plotted versus time. Each of the signals are shown with transition delays which are for illustration only and not intended to convey actual delay timing for particular configurations. At an initial time T0, the EVAL state signal is initially shown low indicating that the IN signals are not in an evaluation state. RESET is shown as a "don't care" at time T0. It is noted that according to RT0 operation, the IN signals (at least those which are RT0 signals) return to zero after an evaluation period before becoming valid for a next evaluation period. However, the individual input signals may have different timing delays. When the IN signals are all asserted at their default state, then EVAL is low and RESET is high. If certain one or more of the IN signals go high without meeting the conditions of the evaluation state just prior to the next evaluation period, then RESET may toggle one or more times while EVAL remains low. Thus, the RESET state signal is shown without a particular state and any such toggling prior to the evaluation event is inconsequential since the RTS enable circuit 207 (implemented as P1 for RT0) is off. The PCHG, OUT, RT0E, RST and RSTB signals are initially asserted to logic 1, 0, 1, 0, and 1, respectively, at time T0.

At subsequent time T1, the IN signals collectively enter an evaluation state so that EVAL goes high and RESET goes low. In response to EVAL being high, the RT0 evaluation circuit 301 causes an evaluation event by pulling PCHG low at subsequent time T2 after a short delay. The RT0 reset circuit 303 is in its isolation state since RESET is low. In response to PCHG going low, the inverter 401 pulls OUT high at subsequent time T3 after a short delay. In response to OUT going high, the inverter 403 pulls RT0E low at subsequent time T4 after a short delay which turns P1 on and N1 off. Since the RT0 reset circuit 303 is off, RST is not driven by any devices and stays low (or is driven by N2 which keeps RST low). The state of the clockless RT0 domino gate 300 remains unchanged while EVAL is high. At subsequent time T5, one or more of the IN signals change state causing the evaluation state to be false indicated by EVAL going low. If each of the IN signals provided to the RT0 reset circuit 303 have also returned to logic zero, then the RESET state signal goes high at time T5 as indicated by dashed line 501. In non-dual embodiments, however, there may be a delay from when EVAL goes low to when RESET goes high. It is noted that since EVAL is low, the evaluation state is false and the RT0 evaluation circuit 301 no longer pulls PCHG low just after time T5. PCHG stays low until subsequently pulled high by P2. It is noted that another half-keeper circuit (not shown) could be provided to keep PCHG low at this time.

At time T5 or at subsequent time T6, the IN signals provided to the RT0 reset circuit 303 go low initiating the reset state of the RT0 reset circuit 303 so that RESET goes high. The RT0 reset circuit 303, together with P1, initiates a reset event by pulling RST high at time T7 after a short delay. The inverter 405 responds by pulling RSTB low at time T8 after a short delay. RSTB going low turns P2 on which pulls PCHG back high to its default state at time T9 after a short delay. When PCHG goes high, the inverter 401 asserts OUT low again at time T10 after a short delay. OUT going low turns P3 on so that the half-keeper circuit 402 maintains PCHG high until subsequently pulled low in a later evaluation period. The inverter 403 pulls RT0E high at time T11 after a short delay. RT0E going high turns N1 on and P1 off. Since P1 is off, the RT0 reset circuit 303 no longer pulls RST high. N1 turning on pulls RST back low at time T12 after a short delay. The inverter 405 pulls RSTB high at time T13 after a short delay so that P2 no longer pulls PCHG high. At this time, the half-keeper circuit 402 maintains PCHG high. Shortly after time T13 as indicated at time T14, the signals are back to their initial default state. Thus, the RT0 evaluation circuit 301 and P1 are both in their default states, the RT0 domino circuit 305 is back in its preset state, and assuming that each of the IN signals are low, the RT0 reset circuit 303 is in its reset state. In summary, an evaluation state of the IN signals invokes an evaluation event causing OUT to go high, and enables a subsequent reset event. A reset state of the IN signals causes the RT0 reset circuit 303 to invoke a reset event, and the clockless RT0 domino gate 300 returns to its initial state for the next evaluation period.

The RESET state signal is shown high up to time T11 when RT0E goes high to ensure that the clockless RT0 gate returns to its initial state, and is shown as "don't care" thereafter. It is noted, however, that once RST is pulled high at time T7, even if the reset state goes false pulling RESET low, RST remains high since not otherwise driven by N1 since N1 is still off. Thus, although the reset state should be held true until the RT0E signal goes high, the input signals could be such as to pull RESET low after time T7 and before time T11 without consequence so that proper circuit operation is maintained. Once RT0E is high, P1 is turned off and any spurious transitions of the IN signals are inconsequential after time T11. Such spurious transitions might otherwise cause an evaluation state. It is noted that RTS signals generally do not have spurious transitions. Certain of the input signals, however, may be non-RTS and may have spurious transitions. The IN signals provided to the RT0 evaluation circuit 301 are selected to prevent a potential evaluation state in this case.

Figure 6:
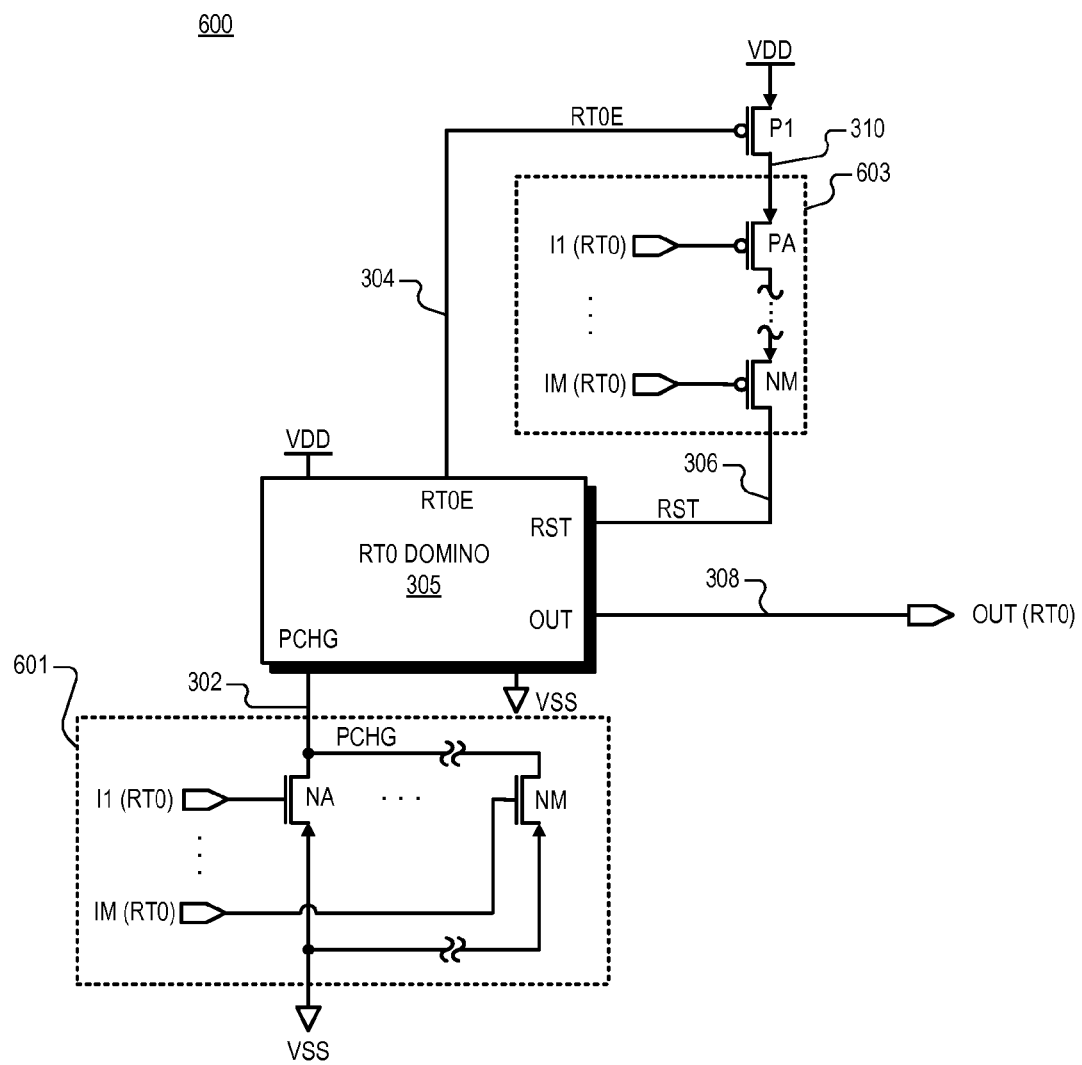
FIG. 6 is a schematic and block diagram of a clockless RT0 domino gate implemented as an OR gate for logically OR'ing M RT0 input signals I1, . . . , IM.

FIG. 6 is a schematic and block diagram of a clockless RT0 domino gate 600 implemented as an OR gate for logically OR'ing M RT0 input signals I1, ..., IM, in which M is a positive integer greater than one. In this case, each of the input signals I1-IM are RT0 signals. The clockless RT0 domino gate 600 includes the RT0 domino circuit 305 coupled to an RT0 evaluation circuit 601 (implementing the RT0 evaluation circuit 301) and to an RT0 reset circuit 603 (implementing RT0 reset circuit 303). The RT0 evaluation circuit 601 includes M N-channel devices NA, ..., NM, each having a drain coupled to node 302 and a source coupled to VSS. The N-channel devices NA-NM each have a gate receiving a corresponding one of the I1-IM input signals as shown. In a similar manner, the RT0 reset circuit 603 includes M P-channel devices PA, ..., PM coupled in a series stack between the secondary reset node 310 and the reset node 306. As shown, the source of a first P-channel device PA is coupled to the drain of P1 at node 310, the drain of PA is coupled to the source of the next P-channel device in the stack and so on up to the last P-channel device PM having its drain coupled to node 306. The P-channel devices PA-PM each have a gate receiving a corresponding one of the I1-IM input signals as shown. Although only two of each of the N-channel devices (NA, NM), the P-channel devices (PA, PM) and the input signals (I1, IM) are actually shown, it is understood by the ellipses that any number of intermediate devices and corresponding signals may be included (e.g., input signal 12 provided to gates of NB and PB, etc.).

The clockless RT0 domino gate 600 is an example of a dual configuration in which the RT0 reset circuit 603 is a dual of the RT0 evaluation circuit 601. Also, in a dual configuration, the same I1-IM signals provided to the RT0 evaluation circuit 601 are provided to the RT0 reset circuit 603. Operation of the clockless RT0 domino gate 600 generally follows the timing diagram shown in FIG. 5. In this case, when each of the input signals I1-IM is at logic 0 according to RT0 operation, EVAL is low and RESET is high. When any one of the input signals I1-IM goes high, the evaluation state is true and the reset state is false so that EVAL is high while RESET is low. Since the circuits 601 and 603 are configured as dual configurations, EVAL and RESET are switched opposite of each other in response to transitions of the IN signals. In response to any IN signal rising to logic 1 causing an evaluation event, PCHG goes low, then OUT goes high after a short delay, and then RT0E goes low after another short delay enabling a reset event. When each of the I1-IM signals goes back to logic 0 according to RT0 operation, the RT0 reset circuit 603 causes a reset event in which RST goes high, RSTB goes low, PCHG is pulled back high, and OUT goes back low as previously described.

In some configurations, the number of P-channel devices stacked within RT0 reset circuit 603 may be limited to a practical number while ensuring proper operation. For example, in one embodiment the maximum number of P-channel devices stacked between VDD and the reset node 306 is four, which limits the number of inputs to three (in which M=3). The clockless RT0 domino gate 600 may be combined or cascaded so that any number of inputs may be OR'd together using multiple gates, as further described below.

Figure 7:
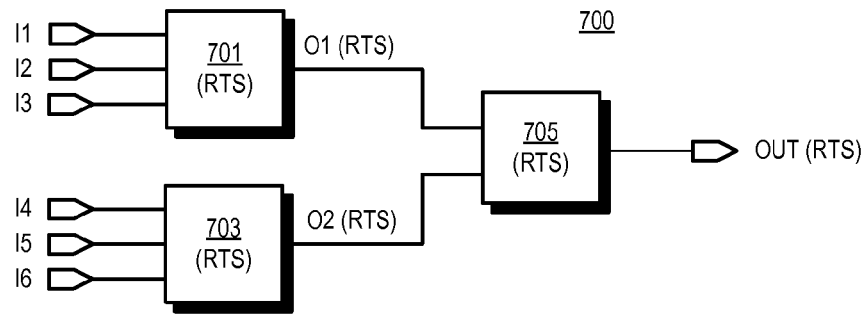
FIG. 7 is a simplified block diagram of a cascaded gate configuration with three clockless RTS domino gates coupled together to perform a logic operation.

FIG. 7 is a simplified block diagram of a cascaded gate configuration 700 with three clockless RTS domino gates 701, 703 and 705 coupled together to perform a logic operation. The cascaded gate configuration 700 is shown in generic RTS form and thus applies to either RT0 or RT1 implementations. In this case, six input signals I1-I6 are logically combined to generate an RTS output signal OUT. At least one up to all of the I1-I3 signals are RTS and at least one up to all of the I4-I6 signals are RTS. The cascaded gate configuration 700 includes 2 3-input clockless RTS domino gates 701 and 703 and another 2-input clockless RTS domino gate 705. The RTS domino gate 701 receives input signals I1-I3 and provides an RTS output signal O1, which is provided to one input of the RTS domino gate 705. Likewise, the RTS domino gate 703 receives input signals I4-I6 and provides an RTS output signal O2, which is provided to the other input of the RTS domino gate 705. The RTS domino gate 705 provides the RTS output signal OUT at its output. In this manner, multiple clockless RTS domino gates may be combined or cascaded together to handle a large number of inputs for a given logic function. Alternative configurations are contemplated. For example, three 2-input gates may each receive two of the 6 input signals, each having an output provided to a respective input of a 3-input gate. Also, any number of input signals may be processed, in which 6 input signals are shown for purposes of illustration.

Each of the gates 701, 703 and 705 in the cascaded gate configuration 700 may be implemented according to any desired logic function, such as AND, OR, NAND, NOR, exclusive-OR (XOR), etc., or any combination of such logic functions provided the appropriate input signals are provided or otherwise available. For example, for an XOR gate performing XOR (A,B), RTS input signals A and B and inverted versions thereof A' and B' (in which an apostrophe "'" following a signal name denotes logical negation) are provided. Also, each of the gates 701, 703 and 705 in the cascaded gate configuration 700 may perform different logic functions. Although only 3 gates are shown, it is understood that any number of gates may be coupled in any combination of serial and parallel coupling configuration as understood by those skilled in the art. For example, each of the gates 701, 703 and 705 may be configured as an OR gate in a similar manner as the clockless RT0 domino gate 600. In this case, the gate 701 is configured as an OR gate which OR's input signals I1-I3 to provide O1, the gate 703 is configured as an OR gate which OR's input signals I4-I6 to provide O2, and gate 705 is configured as an OR gate which OR's signals O1 and O2 to provide OUT. In this manner, multiple clockless RT0 domino gates may be combined or cascaded together to handle a large number of inputs for a given logic function, such as an OR function.

Figure 8:
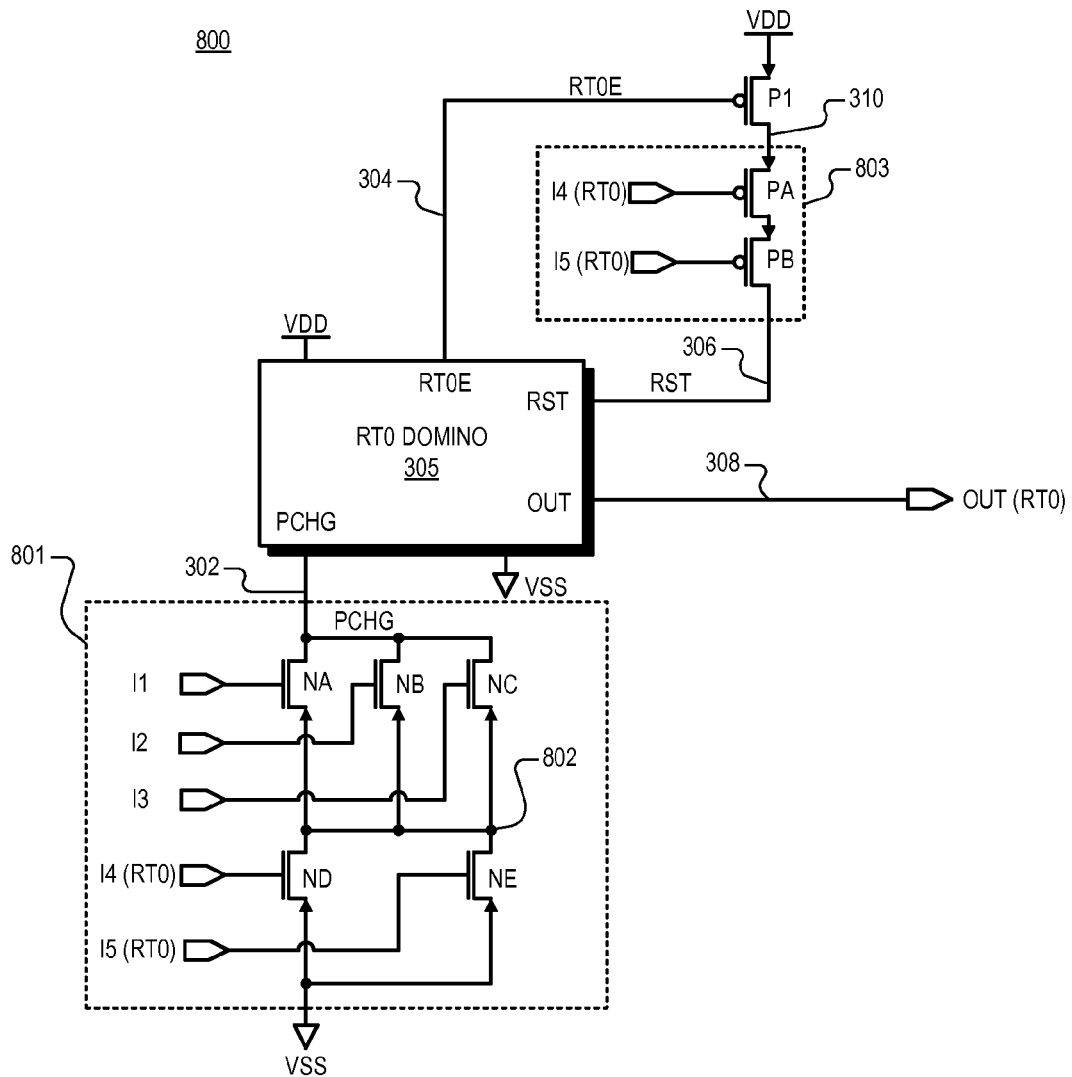
FIG. 8 is a schematic and block diagram of a clockless RT0 domino gate implemented according to another embodiment for performing a miscellaneous logic function.

FIG. 8 is a schematic and block diagram of a clockless RT0 domino gate 800 implemented according to another embodiment for performing a miscellaneous logic function. The clockless RT0 domino gate 800 includes the RT0 domino circuit 305 coupled to an RT0 evaluation circuit 801 (implementing the RT0 evaluation circuit 301) and to an RT0 reset circuit 803 (implementing RT0 reset circuit 303). The RT0 evaluation circuit 801 includes three N-channel devices NA, NB and NC each having a drain coupled to node 302 and a source coupled to an intermediate node 802. The RT0 evaluation circuit 801 further includes two N-channel devices ND and NE each having a drain coupled to node 802 and a source coupled to VSS. The N-channel devices NA-NE each have a gate receiving a corresponding one of five input signals I1-I5. In this case, the RT0 evaluation circuit 801 performs the logic function OUT=(I1|I2|I3) & (I4|I5) in which the symbol "|" denotes the logic OR function and the symbol "&" denotes the logic AND function. An evaluation state occurs whenever any one of the input signals I1-I3 goes high and when at least one of the input signals I4 and I5 also goes high. The RT0 reset circuit 803 includes two P-channel devices PA and PB stacked between the drain of P1 at node 310 and the reset node 306. In particular, PA has a source coupled to the drain of P1 and a drain coupled to the source of PB, and PB has its drain coupled to the reset node 306. The input signal I4 is provided to the gate of PA and the input signal I5 is provided to the gate of PB. In this case, the reset state occurs only when I4 and I5 are both low. The I4 and I5 input signals are RT0, whereas the I1-I3 signals can be RT0 but are not required to be RT0. Although RTS signals are desired, it may be useful in certain configurations to combine non-RTS signals with RTS signals. It may further be desired to have the non-RTS signals meet certain timing constraints relative to the RTS signals. For example, in one embodiment the non-RTS signals may be set up and held relative to transitions of the RTS signals.

Operation of the clockless RT0 domino gate 800 generally follows the timing diagram shown in FIG. 5. In this case, the evaluation state is true when at least one of the input signals I1-I3 goes high and at least one of the input signals I4 and I5 also goes high, and the evaluation state invokes the evaluation event at time T1. As previously described, in response to the evaluation event, PCHG goes low, then OUT goes high and then RT0E goes low, each after a short delay. EVAL stays high as long as the evaluation state is true. The reset state is true only when both I4 and I5 are asserted low. RESET stays low as long as either I4 or I5 is high, so that RESET remains low while EVAL is high. When EVAL goes low at time T5, RESET only goes high if both I4 and I5 are low. RESET may go high at about time T5 if I4 and I5 both go low, but RESET may stay low longer. For example, if each of the input signals I1-I3 goes low while either I4 or I5 remains high, then RESET does not go high when EVAL went low. As soon as I4 and I5 are both low according to RT0 operation, such as by time T6 with reference to FIG. 5, then RESET goes high and the RT0 reset circuit 803 enters its reset state and invokes the reset event. As previously described, in response to the reset event, RST goes high, RSTB goes low, PCHG goes back high and OUT goes back low, each after a short delay.

The clockless RT0 domino gate 800 is one example of a non-dual embodiment in which the RT0 reset circuit 803 is not a dual configuration of the RT0 evaluation circuit 801. In this case, only a subset of the input signals I1-I5, namely I4 and I5, are provided to the RT0 reset circuit 803. Nonetheless, since the evaluation state is true only when at least one of the input signals I4 and I5 is high, the RT0 reset circuit 803 is in its isolation state whenever the RT0 evaluation circuit 801 is in its evaluation state ensuring proper operation. In particular, at the onset of an evaluation event, the RT0 reset circuit 803 is in its isolation state when the RT0 domino circuit 305 transitions to its latch state turning P1 on. RST is released during the evaluation condition. When both I4 and I5 both go back low according to RT0 operation, the RT0 evaluation circuit 801 exits its evaluation state while the RT0 reset circuit 803 enters its reset state invoking a reset event. The reset event transitions the RT0 domino circuit 305 back into its preset state turning P1 off and then pulling RST low in preparation for the next evaluation event.

The logic function of the clockless RT0 domino gate 800 may be performed with using a cascaded gate configuration similar to the cascaded gate configuration 700. For example, gate 701 may be implemented as a 3-input OR gate for input signals I1-I3 providing an output O1, gate 703 may be implemented as a 2-input OR gate for input signals I4 and I5 providing an output O2, and gate 705 may be implemented as a 2-input AND gate for AND'ing signals O1 and O2. In this manner, a cascaded configuration is contemplated for performing the logic function (I1|I2|I3) & (I4|I5). In another alternative configuration, a third P-channel device (not shown) is added to the stack between nodes 310 and 306 and the three stacked P-channel devices receive the I1, I2 and I3 input signals instead. Operation is equivalent although transition out of the latch state back to the preset state may be slightly longer since responsive to three input signals (I1-I3) rather than only two (I4-I5).

Figure 9:
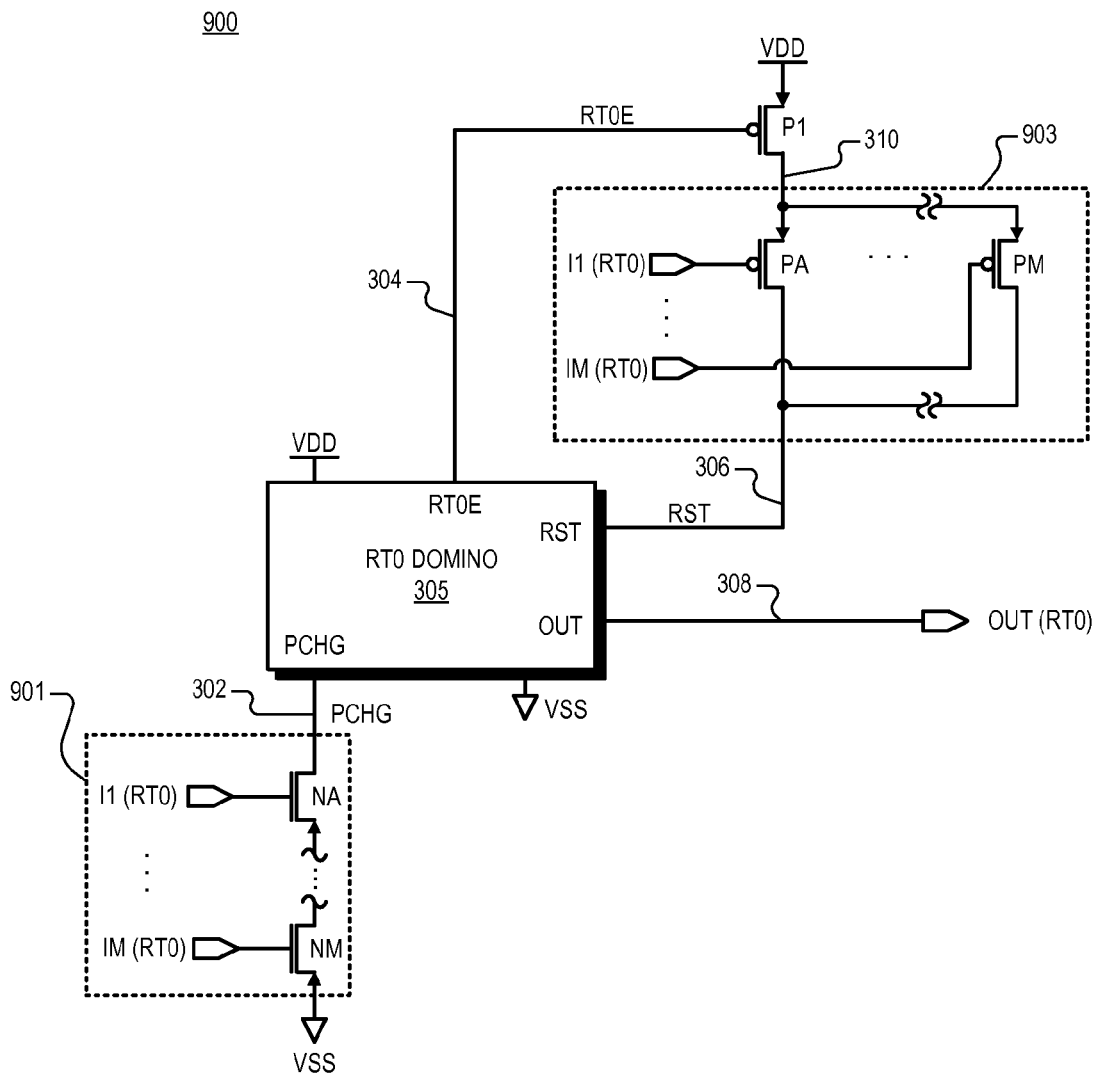
FIG. 9 is a schematic and block diagram of a clockless RT0 domino gate implemented as an AND gate for logically AND'ing the M RT0 input signals I1-IM.

FIG. 9 is a schematic and block diagram of a clockless RT0 domino gate 900 implemented as an AND gate for logically AND'ing the M RT0 input signals I1-IM. In this case for the AND function, each of the I1-IM signals is an RT0 signal. The clockless RT0 domino gate 900 includes the RT0 domino circuit 305 coupled to an RT0 evaluation circuit 901 (implementing the RT0 evaluation circuit 301) and to an RT0 reset circuit 903 (implementing RT0 reset circuit 303). The RT0 evaluation circuit 901 includes M N-channel devices NA-NM stacked in series between the PCHG node 302 and VSS. As shown, the drain of NA is coupled to node 302 and its source is coupled to the drain of the next N-channel device in the stack and so on up to the last N-channel device NM having its source coupled to VSS. The N-channel devices NA-NM each have a gate receiving a corresponding one of the I1-IM input signals as shown. In a similar manner, the RT0 reset circuit 903 includes M P-channel devices PA-PM coupled in parallel between node 310 and the reset node 306. In particular, the sources of PA-PM are coupled to the drain of P1 at node 310 and the drains of PA-PM are coupled to the reset node 306.

The clockless RT0 domino gate 900 is another example of a dual configuration. Operation of the clockless RT0 domino gate 900 generally follows the timing diagram shown in FIG. 5. In this case, the evaluation state is true only when all of the input signals I1-IM are asserted high turning on each of the devices NA-NM, which collectively pull PCHG to VSS. The reset state is true whenever any one of the input signals I1-IM is low. In this case, the RT0 evaluation and reset circuits 901 and 903 are dual configurations of each other. Any suitable number of input signals may be included depending upon the particular implementation. As previously described with respect to the clockless RT0 domino gate 600, however, the number of N-channel devices stacked within RT0 evaluation circuit 901 may be limited to a practical number while ensuring proper operation.

In a similar manner as previously described for the cascaded gate configuration 700, the clockless RT0 domino gate 900 may be cascaded so that any number of inputs may be AND'ed together using multiple AND gates. Each of the gates 701, 703 and 705 may be configured as an AND gate in a similar manner as the clockless RT0 domino gate 900. In this case, the gate 701 is configured as an AND gate which AND's input signals I1-I3 to provide O1, the gate 703 is configured as an AND gate which AND's input signals I4-I6 to provide O2, and gate 705 is configured as an AND gate which AND's signals O1 and O2 to provide OUT. In this manner, multiple clockless RT0 domino gates may be combined or cascaded together to handle a large number of inputs for a given logic function, such as an AND function.

Figure 10:
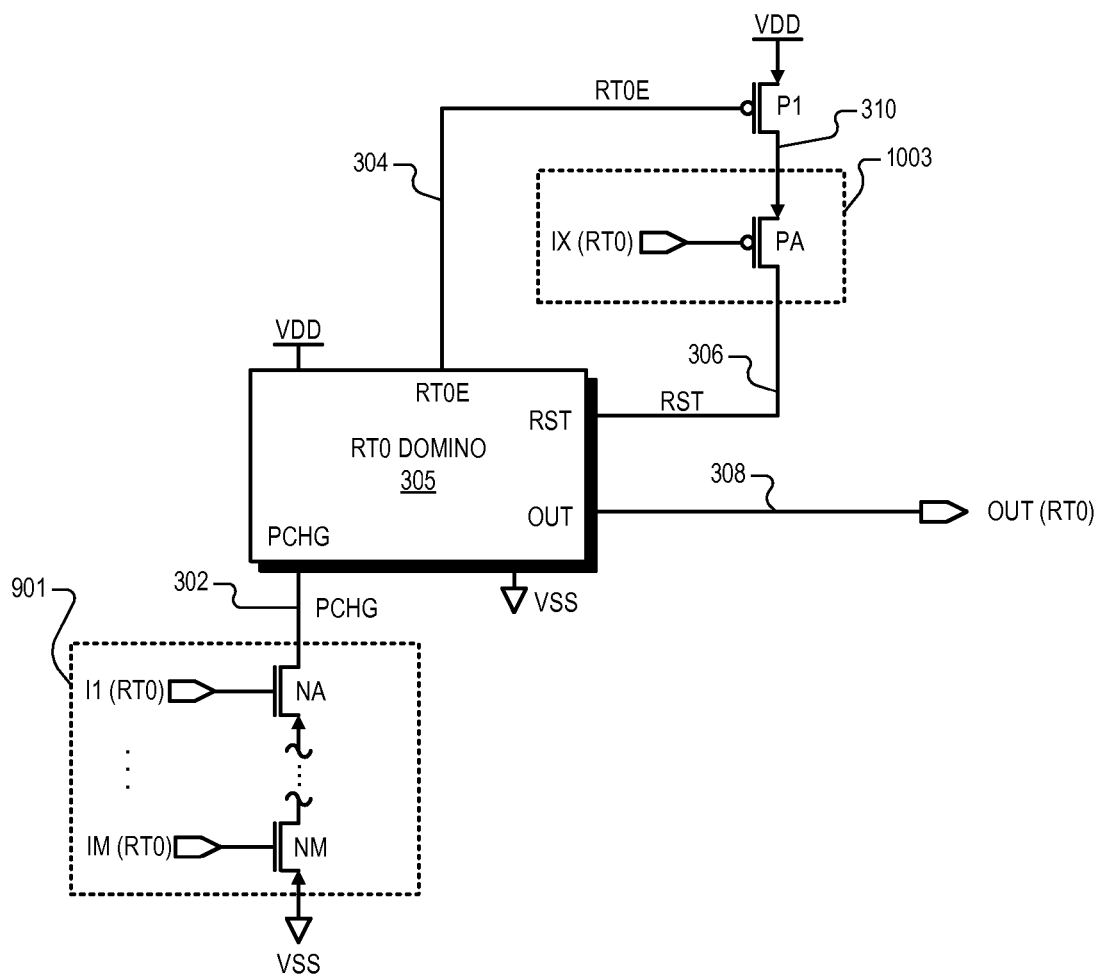
FIG. 10 is a schematic and block diagram of another clockless RT0 domino gate implemented as an AND gate for logically AND'ing the M RT0 input signals I1-IM including a simplified reset circuit.

FIG. 10 is a schematic and block diagram of another clockless RT0 domino gate 1000 implemented as an AND gate for logically AND'ing the M RT0 input signals I1-IM including a simplified reset circuit 1003. The clockless RT0 domino gate 1000 is substantially similar to the clockless RT0 domino gate 900 in which similar components assume identical reference numbers, and where the RT0 reset circuit 903 is replaced with the RT0 reset circuit 1003. Operation of the clockless RT0 domino gate 1000 also generally follows the timing diagram shown in FIG. 5. The RT0 reset circuit 1003 includes only one P-channel device PA having its source coupled to the drain of P1 at node 310 and its drain coupled to the reset node 306. Any one of the input signals I1-IM, generally shown as a signal IX, is provided to the gate of PA.

The clockless RT0 domino gate 1000 is functionally equivalent to the clockless RT0 domino gate 900 except configured in a non-dual embodiment. Operation of the clockless RT0 domino gate 1000 is substantially similar to operation of the clockless RT0 domino gate 900, except that the reset state is true only when the input signal IX is low. When each of the input signals I1-IM, which includes IX, goes high, the reset state is false and an evaluation event occurs. When IX returns to zero, evaluation is false and reset is true invoking a reset event which returns the clockless RT0 domino circuit 305 back into its preset state. The clockless RT0 domino gate 1000 has the benefit of simplifying the RT0 reset circuit since only one P-channel device is included, at a possible speed penalty whenever IX is slower to return to zero as compared to the other input signals. The clockless RT0 domino gate 900 has the benefit of potentially increased speed since the reset event occurs after the evaluation event as soon as any one of the input signals returns to zero, at the cost of a more complicated RT0 reset circuit. If one of the IN signals is guaranteed to be the fastest RT0 signal, then it may be selected as the IX signal eliminating any speed penalty of the clockless RT0 domino gate 1000.

In review of the clockless RT0 domino gate 300 incorporating the RT0 domino circuit 400 as described with reference to the timing diagram of FIG. 5, the clockless RT0 domino gate 300 is in (or returns to) its initial default state when selected ones or all of the input signals (depending upon the specific configuration) are at (or go to) zero according to RT0 operation. When the input signals cause the evaluation state to be true, the reset state is false and an evaluation event is invoked. The reset state remains false as long as the evaluation state is true. The reset state becomes true after the evaluation state goes false when the RT0 input signals provided to the reset circuit return to their default zero state. Reset eventually occurs in accordance with RT0 operation. For the clockless RT0 domino gate 600, the reset event occurs when each of the input signals I1-IM returns to zero. For the clockless RT0 domino gate 800, the reset event occurs when a subset of the input signals I1-I5, namely I4 and I5, return to zero. For the clockless RT0 domino gate 900, the reset event occurs when any one of the input signals I1-IM returns to zero. For the clockless RT0 domino gate 1000, the reset event occurs when a selected one of the input signals, namely IX, returns to zero.

Figure 11:
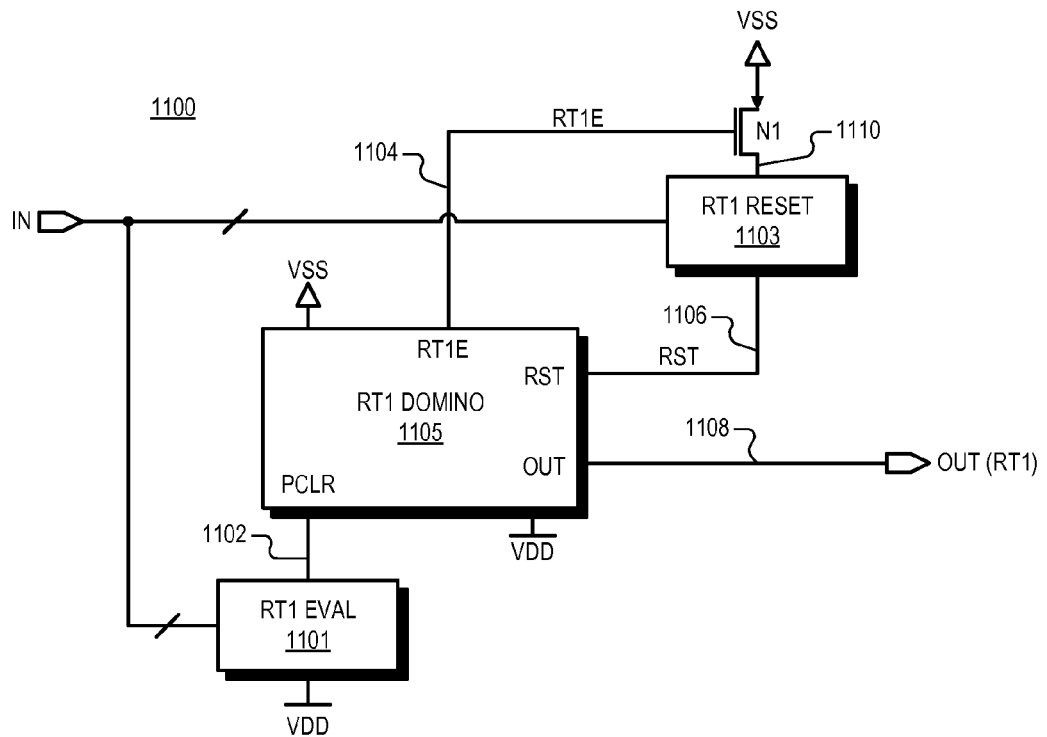
FIG. 11 is a schematic and block diagram of a clockless return to one (RT1) domino gate implemented according to one RT1 embodiment of the clockless RTS domino gate of FIG. 2.

FIG. 11 is a schematic and block diagram of a clockless RT1 domino gate 1100 implemented according to one RT1 embodiment of the clockless RTS domino gate 200. One or more of the input signals and the output signal are configured as RT1 signals having a default logic state of logic 1. VSRC1 is configured as the reference source voltage VSS and VSRC2 is configured as the source voltage VDD, which is reversed or opposite that of the clockless RT0 domino gate 300. The RTS evaluation circuit 201, the RTS domino circuit 205 and the RTS reset circuit 203 are implemented by an RT1 evaluation circuit 1101, an RT1 domino circuit 1105 and an RT1 reset circuit 1103, respectively, which are configured according to RT1 operation. It is noted that although either one of the individual circuits 1101 and 1103 may, in isolation, appear as an RT0 circuit from the perspective of its output, each is referred to as RT1 from the perspective of the inputs and the overall functionality of the RT0 domino gate 1100. The PSET I/O becomes a preclear (PCLR) I/O which is coupled to a preclear node 1102. The output of the clockless RT1 domino gate 1100 asserts an RT1 output signal OUT on an output node 1108, and the reset signal RST is developed on a reset node 1106. The RTSE node 204 becomes an RT1E node 1104 which is coupled to the gate of an N-channel device N1, which implements the RTS enable circuit 207. The source of N1 is coupled to VSS and its drain is coupled to secondary reset node 1110, and the RT1 reset circuit 1103 is coupled between the reset nodes 1110 and 1106.

Figure 12:
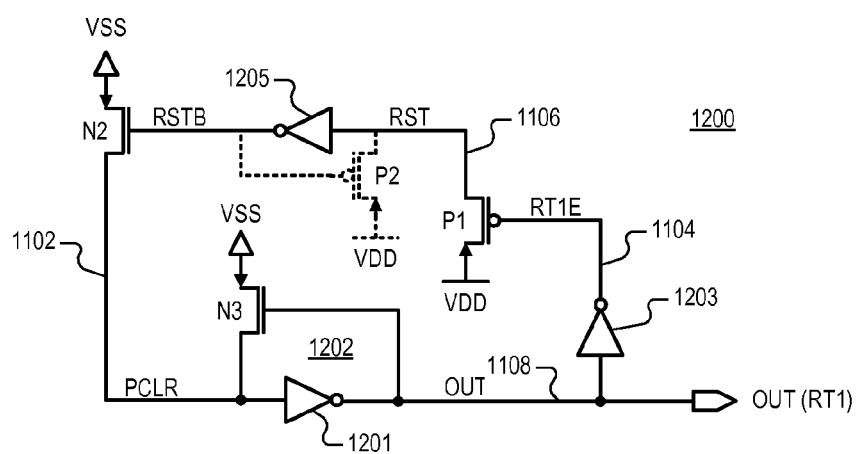
FIG. 12 is a schematic diagram of an RT1 domino circuit illustrating one embodiment of the RT1 domino circuit of FIG. 11.

FIG. 12 is a schematic diagram of an RT1 domino circuit 1200 illustrating one embodiment of the RT1 domino circuit 1105. The RT1 domino circuit 1200 is effectively the inverse of the RT0 domino gate 300 in which VSS replaces VDD and VDD replaces VSS, P-channel devices are replaced by N-channel devices and N-channel devices are replaced by P-channel devices, and the states of each of the nodes are reversed (0->1 and 1->0). Also, the P- and N-channel devices and source voltages within the inverters are reversed, although the same symbol is used since the inversion function is similar. The PCLR node 1102 is coupled to the input of an inverter 1201 and to the drains of N-channel devices N2 and N3. The output of the inverter 1201 is coupled to the output node 1108 developing the RT1 output signal, to the gate of N3 and to the input of another inverter 1203. The output of the inverter 1203 is coupled to node 1104 developing the RT1E signal which is provided to the gate of a P-channel device P1. The source of P1 is coupled to VDD and its drain is coupled to the reset node 1106 developing the reset signal RST. RST is provided to the input of an inverter 1205, which has an output developing an inverted reset signal RSTB. RSTB is provided to the gate of N2, having its source coupled to VSS. The inverter 1201 and N3 collectively form a half-keeper circuit 1202 which keeps PCLR low unless pulled high by the RT1 evaluation circuit 1101. P2 is shown with dashed lines (similar to N2 of the RT0 domino circuit 300) having its gate receiving RSTB, its drain coupled to node 306, and its source coupled to VSS. PCLR is initially precleared low, so that the inverter 1201 asserts OUT high turning on N3. N3 thus maintains PCLR at a low logic state. Since OUT is initially high, the inverter 1203 asserts RT1E low turning on P1, and P1, when turned on, pulls RST high. The inverter 1205 thus pulls RSTB low and N2 is initially off.

Referring to FIGS. 11 and 12, in response to an evaluation event when one or more of the IN signals transition to any one of one or more evaluation states, the RT1 evaluation circuit 1101 pulls PCLR high, to cause the RT1 domino circuit 1200 to transition to its latch state. In particular, the inverter 1201 pulls OUT low turning N3 off. The inverter 1203 pulls RT1E high turning on N1 and turning off P1. N1 is enabled to couple node 1110 to VSS. P1 is turned off so that it no longer drives RST high. The evaluation state of the IN signals cause the RT1 reset circuit 1103 to transition to its isolation state so that it isolates node 1106 from 1110. In this manner, reset node 1106 is temporarily isolated so that RST is not driven to any particular state. Nonetheless, RST stays high since not driven high by any other device. While the IN signals are in an evaluation state, the RT1 reset circuit 1103 remains in its isolation state.

When each of the IN signals that are provided to the RT1 reset circuit 1103 return back to its default state, the RT1 reset circuit 1103 transitions to its reset state causing a reset event in which N1 and the RT1 reset circuit 1103 collectively pull RST low. The inverter 1205 responds by pulling RSTB high turning on N2. N2, when turned on, pulls PCLR back low to its default state. Note that when each of the IN signals provided to the RT1 reset circuit 1103 return back to its default state, the IN signals are no longer in an evaluation state so that the RT1 evaluation circuit 1101 no longer pulls PCLR high. In this manner, N2 pulls PCLR back low again to it preclear state. When PCLR goes high, the inverter 1201 asserts OUT high again turning on N3 to keep PCLR low. The inverter 1103 pulls RT1E low turning on P1 and turning off N1. Since N1 is turned off, the RT1 reset circuit 1103 is isolated from VSS and can no longer pull RST low. Furthermore, P1 turns on pulling RST back high and the inverter 1105 pulls RSTB low to turn off N2. Although N2 turns off, the half-keeper circuit 1202 keeps PCLR low. In this manner, the RT1 domino circuit 1200 resets back to its preset state in preparation for the next evaluation event.

Figure 13:
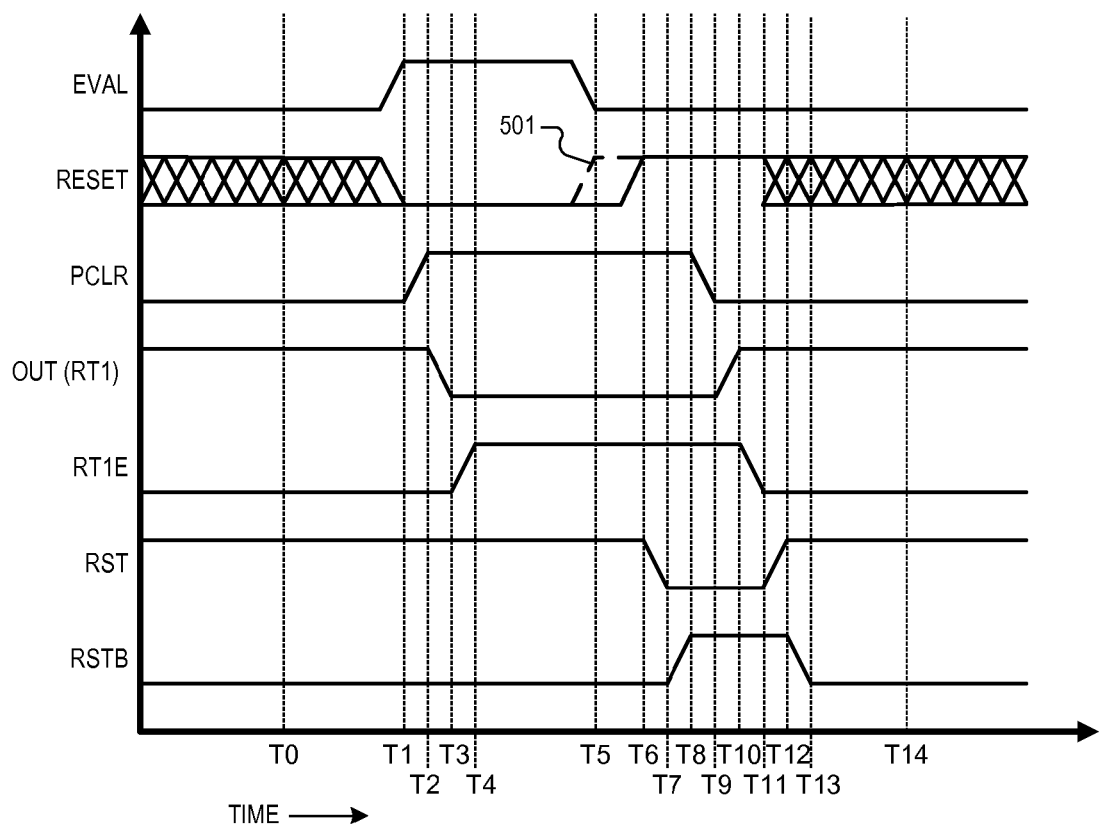
FIG. 13 is a timing diagram illustrating operation of the clockless RT1 domino gate of FIG. 11 using the RT1 domino circuit of FIG. 12 according to one embodiment.

FIG. 13 is a timing diagram illustrating operation of the clockless RT1 domino gate 1100 using the RT1 domino circuit 1200 as the RT1 domino circuit 1105 according to one embodiment. The timing diagram of FIG. 13 is substantially similar to the timing diagram of FIG. 5 with the exception of a change of a few signal names and inverse states of the circuit signals. In particular, PCHG is replaced by PCLR, OUT (RT0) is replaced by OUT (RT1), and RT0E is replaced by RT1E. The states of PCLR, OUT (RT1), RT1E, RST and RSTB are opposite that of the states of PCHG, OUT (RT0), RT0E, RST and RSTB, respectively. Nonetheless, transition timing is substantially similar with possible minor variation in the short delays. The EVAL and RESET state signals are included and operate in substantially identical manner. In this case, EVAL represents an evaluation state of the RT1 evaluation circuit 1101, in which EVAL is high when the evaluation state is true and is low when the evaluation state is false. RESET represents the reset state of the RT1 reset circuit 1103, in which RESET is high when the reset state is true and is low when the reset state is false. The reset state causes a reset event only when RT1E is high after an evaluation event.

The EVAL, RESET, PCLR, OUT, RT1E, RST and RSTB signals are plotted versus time. Each of the signals are shown with transition delays which are for illustration only and not intended to convey actual delay timing. At an initial time T0, the EVAL state signal is initially shown low indicating that the IN signals are not in an evaluation state. RESET is shown as a "don't care" at time T0 for similar reasons previously described with respect to FIG. 5. The PCLR, OUT, RT1E, RST and RSTB signals are initially asserted to logic 0, 1, 0, 1, and 0, respectively, at time T0.

At subsequent time T1, the IN signals collectively enter evaluation state so that EVAL goes high and RESET goes low. In response to EVAL being high, the RT1 evaluation circuit 1101 causes an evaluation event by pulling PCLR high at subsequent time T2 after a short delay. The RT1 reset circuit 1103 is in its isolation state since RESET is low. In response to PCLR going high, the inverter 1201 pulls OUT low at subsequent time T3 after a short delay. In response to OUT going low, the inverter 1203 pulls RT1E high at subsequent time T4 after a short delay which turns N1 on and P1 off. Since the RT1 reset circuit 1103 is off, RST is not driven by any devices and stays high (or is otherwise driven by P2 to stay high if P2 is provided). The state of the clockless RT1 domino gate 1200 remains unchanged while EVAL is high. At subsequent time T5, one or more of the IN signals change state causing the evaluation state to be false indicated by EVAL going low. If each of the IN signals provided to the RT1 reset circuit 1103 have also returned to logic one, then the RESET state signal goes high at time T5 as indicated by dashed line 501. In non-dual configurations, however, there may be a delay from when EVAL goes low to when RESET goes high. It is noted that since EVAL is low, the evaluation state is false and the RT1 evaluation circuit 1101 no longer pulls PCLR high just after time T5. PCLR stays high until subsequently pulled low by N2.

At time T5 or at subsequent time T6, the IN signals provided to the RT1 reset circuit 1103 go high initiating the reset state of the RT1 reset circuit 1103 so that RESET goes high. The RT1 reset circuit 1103, together with N1, initiates a reset event by pulling RST low at time T7 after a short delay. The inverter 1205 responds by pulling RSTB high at time T8 after a short delay. RSTB going high turns N2 on which pulls PCLR back low to its default state at time T9 after a short delay. When PCLR goes low, the inverter 1201 asserts OUT high again at time T10 after a short delay. OUT going high turns N3 on so that the half-keeper circuit 1202 maintains PCLR low until subsequently pulled low in a later evaluation period. The inverter 1203 pulls RT1E low at time T11 after a short delay. RT going low turns P1 on and N1 off. Since N1 is off, the RT1 reset circuit 1103 no longer pulls RST low. P1 turning on pulls RST back high at time T12 after a short delay. The inverter 1205 pulls RSTB low at time T13 after a short delay so that N2 no longer pulls PCLR low. At this time, the half-keeper circuit 1202 maintains PCLR low. Shortly after time T13 as indicated at time T14, the signals are back to their initial default state. Thus, the RT1 evaluation circuit 1101 and N1 are both in their default states, the RT1 domino circuit 1105 is back in its preset state, and assuming that each of the IN signals are high, the RT1 reset circuit 1103 is in its reset state. In summary, an evaluation state of the IN signals invokes an evaluation event causing OUT to go low, and enables a subsequent reset event. A reset state of the IN signals causes the RT1 reset circuit 1103 to invoke a reset event, and the clockless RT1 domino gate 1100 returns to its initial state for the next evaluation period.

In a similar manner as previously stated for the timing diagram of FIG. 5, the RESET state signal is shown high up to time T11 when RT1E goes low to ensure that the clockless RT1 gate returns to its initial state, and is shown as "don't care" thereafter. It is noted, however, that once RST is pulled low at time T7, even if the reset state goes false pulling RESET low, RST remains low since not otherwise driven by P1 since P1 is still off. Thus, although the reset state should be held true until the RT1E signal goes low, the input signals could be such as to pull RESET low after time T7 and before time T11 without affecting proper circuit operation. Once RT1E is low, P1 is turned off and any spurious transitions of the IN signals are inconsequential after time T11.

Figure 14:
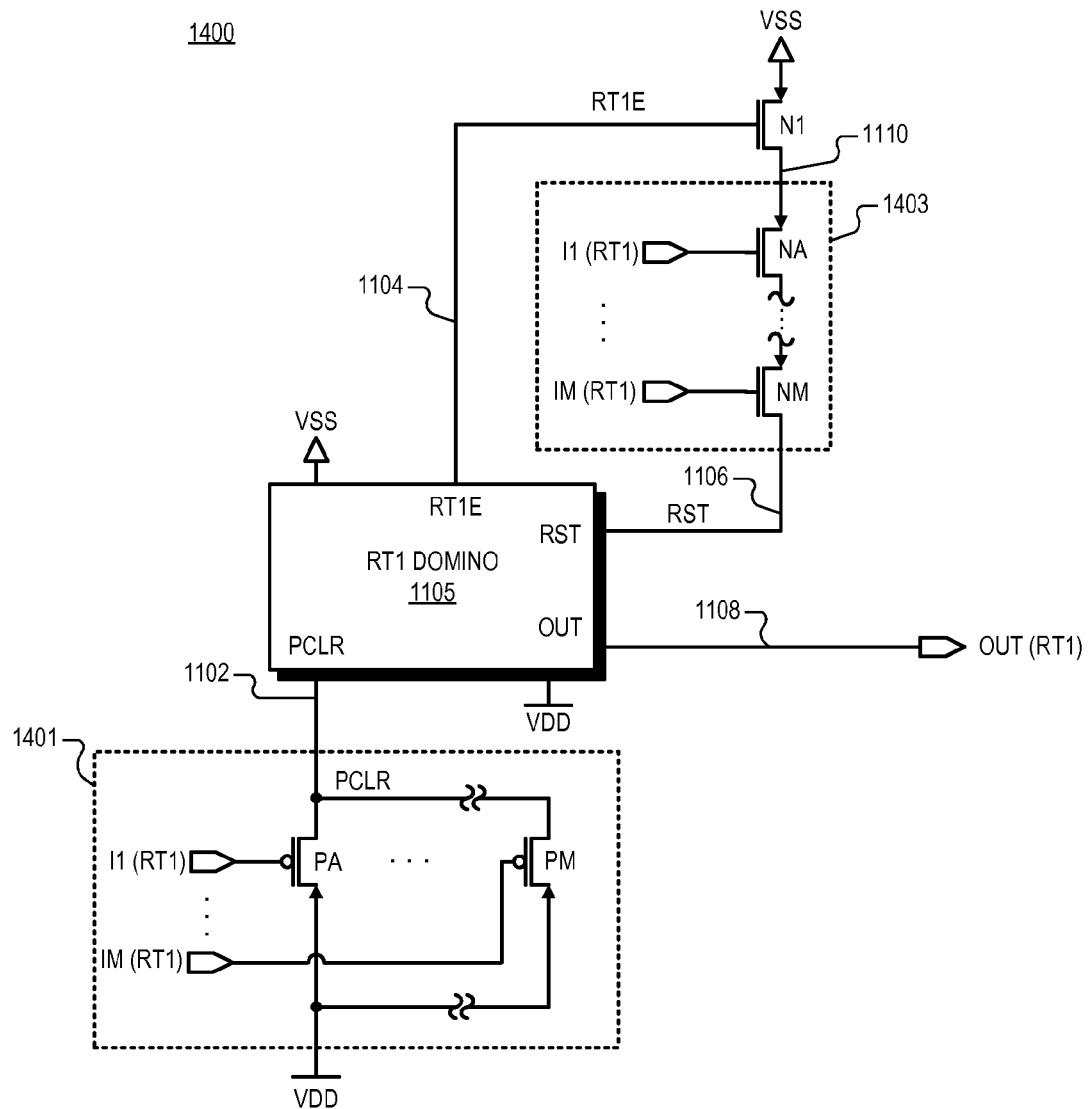
FIG. 14 is a schematic and block diagram of a clockless RT1 domino gate implemented as an OR gate for logically OR'ing M RT1 input signals I1-IM.

FIG. 14 is a schematic and block diagram of a clockless RT1 domino gate 1400 implemented as an OR gate for logically OR'ing M RT1 input signals I1-IM. The clockless RT1 domino gate 1400 includes the RT1 domino circuit 1105 coupled to an RT1 evaluation circuit 1401 (implementing the RT1 evaluation circuit 1101) and to an RT1 reset circuit 1403 (implementing RT1 reset circuit 1103). The RT1 evaluation circuit 1401 includes M P-channel devices PA, . . . , PM each having a drain coupled to node 1102 and a source coupled to VDD. The P-channel devices PA-PM each have a gate receiving a corresponding one of the I1-IM input signals as shown. In a similar manner, the RT1 reset circuit 1403 includes M N-channel devices NA, . . . , NM coupled in series between node 1110 and the reset node 1106. As shown, the source of a first N-channel device NA is coupled to node 1110 at the drain of N1, the drain of NA is coupled to the source of the next N-channel device in the stack and so on up to the last N-channel device NM having its drain coupled to node 1106. The N-channel devices NA-NM each have a gate receiving a corresponding one of the I1-IM input signals as shown. Although only two of each of the N-channel devices (NA, NM), the P-channel devices (PA, PM) and the input signals (I1, IM) are actually shown, it is understood by the ellipses that any number of intermediate devices and corresponding signals may be included (e.g., input signal 12 provided to gates of NB and PB, etc.).

The clockless RT1 domino gate 1400 is an example of a dual configuration in which the RT1 reset circuit 1403 is a dual of the RT1 evaluation circuit 1401. Also, in a dual configuration, the same I1-IM signals provided to the RT1 evaluation circuit 1401 are provided to the RT1 reset circuit 1403. Operation of the clockless RT1 domino gate 1400 generally follows the timing diagram shown in FIG. 13. In this case, when each of the input signals I1-IM is at logic one according to RT1 operation, EVAL is low and RESET is high. When any one of the input signals I1-IM goes low, the evaluation state is true and the reset state is false so that EVAL is high while RESET is low. Since the circuits 1401 and 1403 are configured as dual configurations, EVAL and RESET are switched opposite of each other in response to transitions of the IN signals. In response to any input signal falling to logic 0 causing an evaluation event, PCLR goes high, and OUT goes low after a short delay and RT1E goes high after another short delay enabling a reset event. When all of the I1-IM signals go back to logic 1 according to RT1 operation, the RT1 reset circuit 1403 causes a reset event in which RST goes low, RSTB goes high, PCLR is pulled back low, and OUT goes back high as previously described.

In some configurations, the number of N-channel devices stacked within RT1 reset circuit 1403 may be limited to a practical number while ensuring proper operation. For example, in one embodiment the maximum number of N-channel devices stacked between VSS and the reset node 1106 is four, which limits the number of inputs to three (in which M=3). With reference to FIG. 7, each of the gates 701, 703 and 705 may be configured as an RT1 OR gate in a similar manner as the clockless RT1 domino gate 1400. In this case, the gate 701 is configured as an OR gate which OR's RT1 input signals I1-I3 to provide RT1 signal O1, the gate 703 is configured as an RT1 OR gate which OR's RT1 input signals I4-I6 to provide RT1 signal O2, and gate 705 is configured as an RT1 OR gate which OR's signals O1 and O2 to provide the output signal OUT as an RT1 signal. In this manner, multiple clockless RT1 domino gates may be combined or cascaded together to handle a large number of RT1 inputs for a given logic function, such as an OR function.

Figure 15:
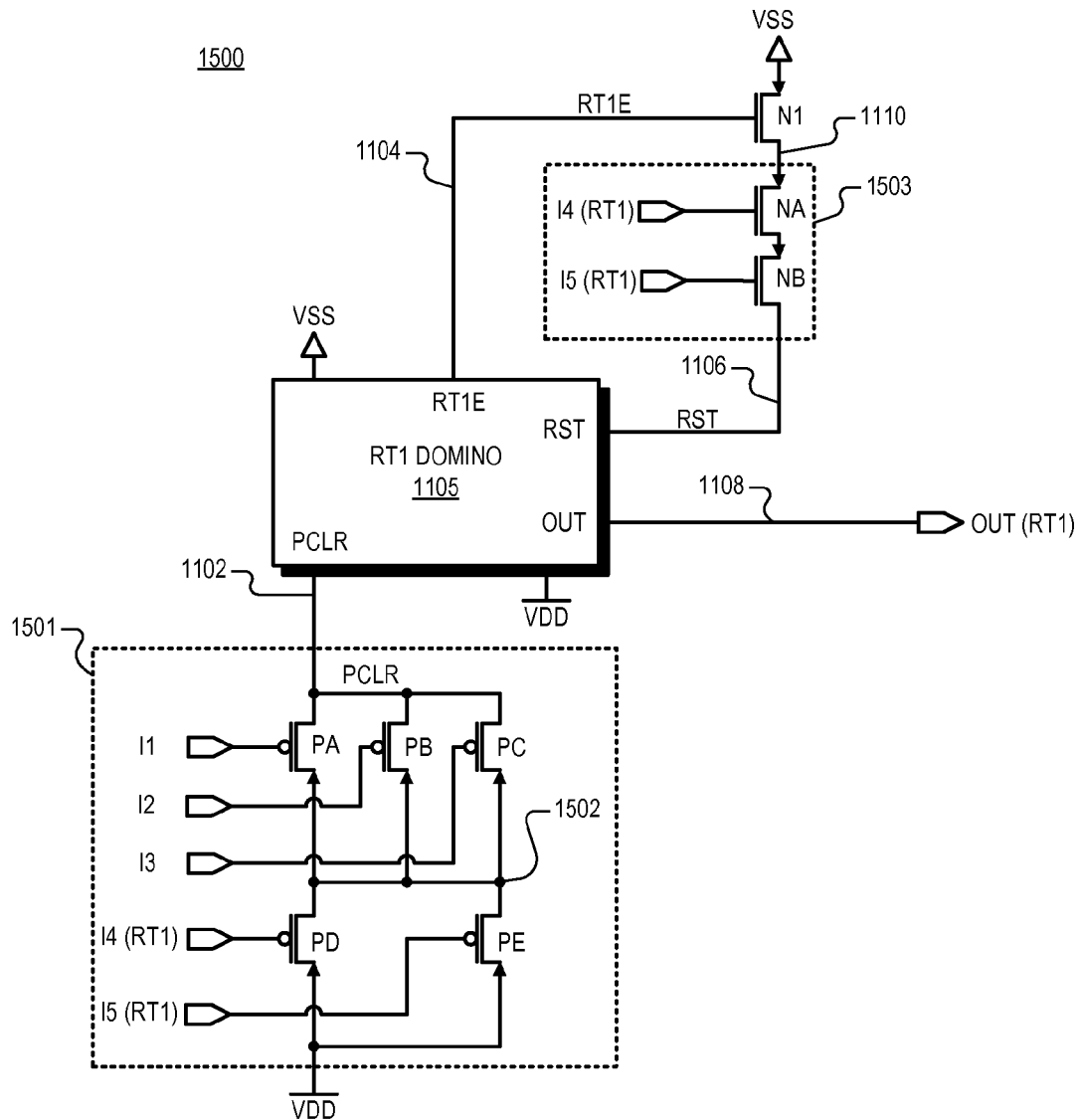
FIG. 15 is a schematic and block diagram of a clockless RT1 domino gate 1500 implemented according to another embodiment for performing a miscellaneous logic function.

FIG. 15 is a schematic and block diagram of a clockless RT1 domino gate 1500 implemented according to another embodiment for performing a miscellaneous logic function. The clockless RT1 domino gate 1500 includes the RT1 domino circuit 1105 coupled to an RT1 evaluation circuit 1501 (implementing the RT1 evaluation circuit 1101) and to an RT1 reset circuit 1503 (implementing RT1 reset circuit 1103). The clockless RT1 domino gate 1500 is configured in substantially similar manner as the clockless RT0 domino gate 800, except in an inverse manner according to RT1 operation. In particular, VDD is replaced by VSS and VSS is replaced by VDD, N-channel devices are replaced by P-channel devices and P-channel devices are replaced by N-channel devices, the input signals I4-I5 operate according to RT1 rather than RT0, the signal states are reversed, and the input signals I1-I3 are RT1 or non-RT1 signals. Nodes 302, 304, 306, 308 and 310 are replaced with similar nodes 1102, 1104, 1106, 1108 and 1110, respectively, performing analogous functions in a similar manner as described for FIGS. 11-14. Operation of the clockless RT1 domino gate 1500 generally follows the timing diagram shown in FIG. 13. The clockless RT1 domino gate 1500 performs the logic function OUT=~((~I1|~I2|~I3) & (~I4|~I5)) in which the symbol "~" denotes logical negation.

Similar to the clockless RT0 domino gate 800, the clockless RT1 domino gate 1500 is another example of a non-dual embodiment in which the RT1 reset circuit 1503 is not a dual configuration of the RT1 evaluation circuit 1501. Only a subset of the input signals I1-I5, namely I4 and I5, are provided to the RT1 reset circuit 1503, so that the evaluation state is true only when at least one of the input signals I4 and I5 is low, and the RT1 reset circuit 1503 is in its isolation state whenever the RT1 evaluation circuit 1501 is in its evaluation state ensuring proper operation in a similar manner as described above with reference to the clockless RT0 domino gate 800. Also, the logic function of the clockless RT1 domino gate 1500 may be performed with using a cascaded gate configuration similar to the cascaded gate configuration 700. An alternative configuration is contemplated in which a third N-channel device (not shown) is added to the stack between nodes 1110 and 1106 and the three stacked N-channel devices receive the I1, I2 and I3 input signals instead. Operation is equivalent although transition out of the latch state back to the preset state may be slightly longer since responsive to three input signals (I1-I3) rather than only two (I4-I5).

Figure 16:
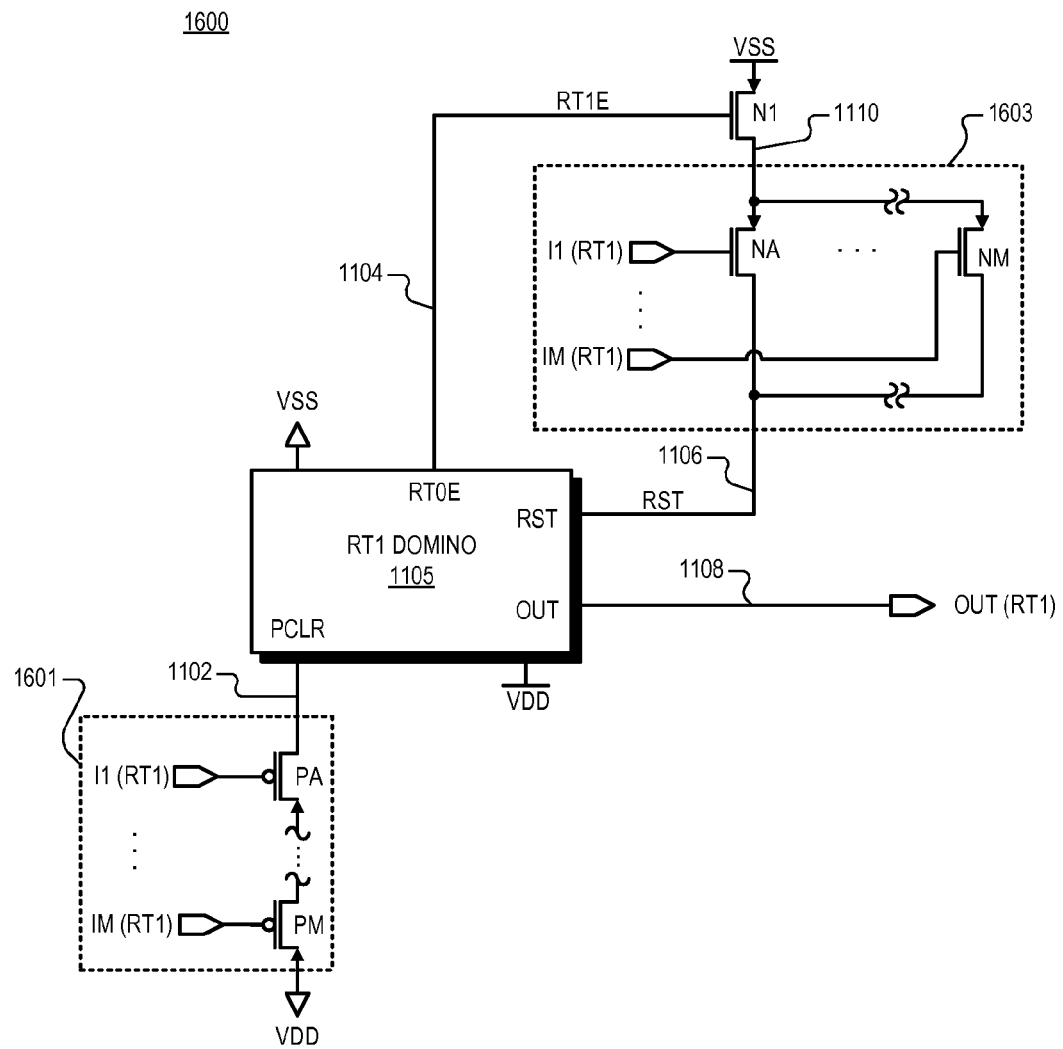
FIG. 16 is a schematic and block diagram of a clockless RT1 domino gate implemented as an AND gate for logically AND'ing the M RT1 input signals I1-IM.

FIG. 16 is a schematic and block diagram of a clockless RT1 domino gate 1600 implemented as an AND gate for logically AND'ing the M RT1 input signals I1-IM. The clockless RT1 domino gate 1600 includes the RT1 domino circuit 1105 coupled to an RT1 evaluation circuit 1601 (implementing the RT1 evaluation circuit 1101) and to an RT1 reset circuit 1603 (implementing RT1 reset circuit 1103). The clockless RT1 domino gate 1600 is configured in substantially similar manner as the clockless RT0 domino gate 900 except in an inverse manner according to RT1 operation. In particular, VDD replaces VSS and VSS replaces VDD, N-channel devices are replaced by P-channel devices and P-channel devices are replaced by N-channel devices, the input signals I1-I5 operate according to RT1 rather than RT0, OUT is RT1 rather than RT0, and the signal states are reversed. Nodes 302, 304, 306, 308 and 310 are replaced with similar nodes 1102, 1104, 1106, 1108 and 1110, respectively, performing analogous functions in a similar manner as described for FIGS. 11-14.

The clockless RT1 domino gate 1600 is another example of a dual configuration. Operation of the clockless RT1 domino gate 1600 generally follows the timing diagram shown in FIG. 13. In this case, the evaluation state is true only when all of the input signals I1-IM are asserted low turning on each of the devices PA-PM, which collectively pull PCLR to VDD. The reset state is true whenever any one of the input signals I1-IM is high. In this case, the RT1 evaluation and reset circuits 1601 and 1603 are dual configurations of each other. Any suitable number of input signals may be included depending upon the particular implementation. In a similar manner as previously described with respect to the clockless RT1 domino gate 1400, however, the number of P-channel devices stacked within RT1 evaluation circuit 1601 may be limited to a practical number while ensuring proper operation. With reference to FIG. 7, each of the gates 701, 703 and 705 may be configured as an RT1 AND gate in a similar manner as the clockless RT1 domino gate 1600. In this manner, multiple clockless RT1 domino gates may be combined or cascaded together to handle a large number of inputs for a given logic function, such as an AND function.

Figure 17:
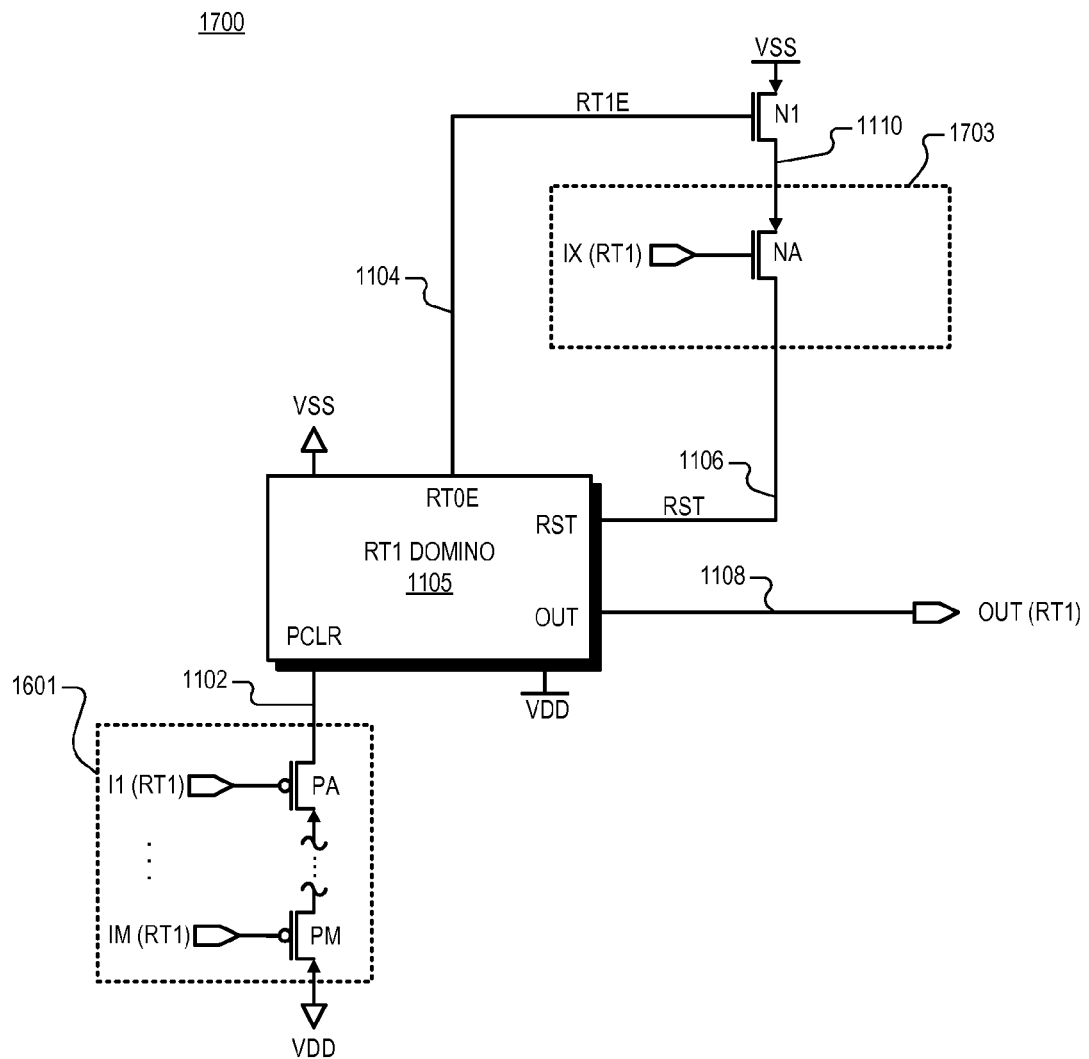
FIG. 17 is a schematic and block diagram of another clockless RT1 domino gate implemented as an AND gate for logically AND'ing the M RT1 input signals I1-IM including a simplified reset circuit.

FIG. 17 is a schematic and block diagram of a clockless RT1 domino gate 1700 implemented as an AND gate for logically AND'ing the M input signals I1-IM including a simplified reset circuit 1703. The clockless RT1 domino gate 1700 is substantially similar to the clockless RT1 domino gate 1600 in which similar components assume identical reference numbers, and where the RT1 reset circuit 1603 is replaced with the RT1 reset circuit 1703. Operation of the clockless RT1 domino gate 1700 also generally follows the timing diagram shown in FIG. 13. The RT1 reset circuit 1703 includes only one N-channel device NA having its source coupled to the drain of N1 at node 1110 and its drain coupled to the reset node 1106. Any one of the input signals I1-IM, generally shown as a signal IX, is provided to the gate of NA.

The clockless RT1 domino gate 1700 is functionally equivalent to the clockless RT1 domino gate 1600 except configured in a non-dual embodiment. Operation of the clockless RT1 domino gate 1700 is substantially similar to operation of the clockless RT1 domino gate 1600, except that the reset state is true only when the input signal IX is high. When each of the input signals I1-IM, which includes IX, goes low, the reset state is false and an evaluation event occurs. When IX returns to zero, evaluation is false and reset is true invoking a reset event which returns the clockless RT1 domino circuit 1105 back into its preset state. The clockless RT1 domino gate 1700 has the benefit of simplifying the RT1 reset circuit since only one N-channel device is included, at a slight speed penalty whenever IX is slower to return to one as compared to the other input signals. The clockless RT1 domino gate 1600 has the benefit of potentially increased speed since the reset event occurs after the evaluation event as soon as any one of the input signals returns to one, at the cost of a more complicated RT1 reset circuit. The speed penalty of the gate 1700 is removed is IX is guaranteed as the fastest IN signal to return to one.

In review of the clockless RT1 domino gate 1100 incorporating the RT1 domino circuit 1200 as described with reference to the timing diagram of FIG. 13, the clockless RT1 domino gate 1100 is in (or returns to) its initial default state when the input signals are at (or go to) one according to RT1 operation. When the input signals cause the evaluation state to be true, the reset state is false and an evaluation event is invoked. The reset state remains false as long as the evaluation state is true. The reset state becomes true after the evaluation state goes false when the input signals provided to the reset circuit return to their default one state. Reset eventually occurs in accordance with RT1 operation. For the clockless RT1 domino gate 1400, the reset event occurs when each of the input signals I1-IM returns to one. For the clockless RT1 domino gate 1500, the reset event occurs when a subset of the input signals I1-I5, namely I4 and I5, return to one. For the clockless RT1 domino gate 1600, the reset event occurs when any one of the input signals I1-IM returns to one. For the clockless RT1 domino gate 1700, the reset event occurs when a selected one of the input signals, namely IX, returns to one.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware or the like within an integrated device. The circuits described herein may include inverting devices implementing positive or negative logic or the like in which any signal may be inverted. The present invention is described using circuits operating with digital or binary bytes and words where it is understood that the circuitry applies to digital or binary values comprising any number of bits. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A clockless return to state domino logic gate which is responsive to a plurality of input logic signals in which each input logic signal switches between first and second logic states, wherein said clockless return to state domino logic gate comprises:
    a domino circuit, comprising:
        a plurality of nodes which switch between the first and second logic states, said plurality of nodes including a preset node, an output node, an enable node, and a first reset node;
        a first inverter having an input coupled to said preset node and an output coupled to said output node;
        a first device of a first conductivity type having a control terminal coupled to said output node, having a first current terminal coupled to a first source voltage node associated with the first logic state, and having a second current terminal coupled to said preset node;
        a second inverter having an input coupled to said output node and an output coupled to said enable node;
        a first device of a second conductivity type having a first current terminal coupled to a second source voltage node associated with the second logic state, having a control terminal coupled to said enable node, and having a second current terminal coupled to said first reset node;
        a third inverter having an input coupled to said first reset node and having an output; and
        a second device of said first conductivity type having a first current terminal coupled to said first source voltage node, having a control terminal coupled to said output of said third inverter, and having a second current terminal coupled to said preset node; and
    an input circuit coupled said preset node, said reset node and said enable node and is configured to be responsive to the plurality of input logic signals, wherein said input circuit pulls said preset node to the second logic state when the plurality of input logic signals are in any one of at least one evaluation state, and wherein said input circuit temporarily pulls said first reset node to the first logic state when the plurality of input logic signals transitions out of any one of said at least one evaluation state.

2. The clockless return to state domino logic gate of claim 1, wherein said input circuit comprises:
    an evaluation circuit configured to respond to the plurality of input logic signals, wherein said evaluation circuit pulls said preset node to the second logic state when the plurality of input logic signals are in any one of at least one evaluation state;
    an enable circuit which pulls a second reset node to the first logic state when said enable node is in the second logic state; and
    a reset circuit configured to respond to at least one of the plurality of input logic signals, wherein said reset circuit couples said first reset node to said second reset node when the plurality of input logic signals are not in any one of said at least one evaluation state.

3. The clockless return to state domino logic gate of claim 2, wherein at least one of the plurality of input signals comprises a return to state signal provided to said evaluation circuit and said reset circuit.

4. The clockless return to state domino logic gate of claim 1, further comprising a second device of said second conductivity type having a control terminal coupled to said output of said third inverter, having a first current terminal coupled to said first reset node, and having a second current terminal coupled to said second source voltage node.

5. The clockless return to state domino logic gate of claim 1, wherein said first source voltage node has a positive source voltage, wherein said second source voltage node has a reference voltage, wherein said first conductivity type comprises P-type, and wherein said second conductivity type comprises N-type.

6. The clockless return to state domino logic gate of claim 1, wherein said first source voltage node has a reference voltage, wherein said second source voltage node has a positive source voltage, wherein said first conductivity type comprises N-type, and wherein said second conductivity type comprises P-type.

7. The clockless return to state domino logic gate of claim 1, wherein said first and second source voltage nodes have a positive source voltage and a reference voltage, respectively, wherein at least one of the plurality of input logic signals comprises a return to zero signal, wherein:
    said preset node comprises a precharge node;
    wherein said first device of said first conductivity type comprises a first P-channel device having a gate coupled to said output node, having a source receiving said positive source voltage, and having a drain coupled to said precharge node;
    wherein said first device of said second conductivity type comprises a first N-channel device having a source receiving said reference voltage, having a gate coupled to said enable node, and having a drain coupled to said reset node; and wherein said second device of said first conductivity type comprises a second P-channel device having a source receiving said positive source voltage, having a gate coupled to said output of said third inverter, and having a drain coupled to said precharge node.

8. The clockless return to state domino logic gate of claim 1, wherein the first and second source voltage nodes comprise a reference voltage and a positive source voltage, respectively, wherein at least one of the plurality of input logic signals comprises a return to one signal, wherein:
   said preset node comprises a preclear node;
   wherein said first device of said first conductivity type comprises a first N-channel device having a gate coupled to said output node, having a source receiving said reference voltage, and having a drain coupled to said preclear node;
   wherein said first device of said second conductivity type comprises a first P-channel device having a source receiving said positive source voltage, having a gate coupled to said enable node, and having a drain coupled to said reset node; and
   wherein said second device of said first conductivity type comprises a second N-channel device having a source receiving said reference voltage, having a gate coupled to said output of said third inverter, and having a drain coupled to said preclear node.

9. An integrated circuit, comprising:
   a first circuit providing at least one return to state signal, wherein each of said at least one return to state signal switches between a first state and a second state, and wherein said first circuit asserts each of said at least one return to state signal to said second state after being asserted to said first state according to return to state operation;
   a plurality of nodes which switch between the first and second logic states, said plurality of nodes including a preset node, an output node, an enable node, a reset node, and a plurality of input nodes in which at least one of said plurality of input nodes receives one of said at least one return to state signal;
   a first inverter having an input coupled to said preset node and an output coupled to said output node;
   a first device of a first conductivity type having a control terminal coupled to said output node, having a first current terminal receiving a first source voltage associated with said first logic state, and having a second current terminal coupled to said preset node;
   a second inverter having an input coupled to said output node and an output coupled to said enable node;
   a first device of a second conductivity type having a first current terminal receiving a second source voltage associated with said second logic state, having a control terminal coupled to said enable node, and having a second current terminal coupled to said reset node;
   a third inverter having an input coupled to said reset node and having an output;
   a second device of said first conductivity type having a first current terminal receiving said first source voltage, having a control terminal coupled to said output of said third inverter, and having a second current terminal coupled to said preset node; and
   an input circuit coupled said preset node, to said reset node, to said enable node and to said plurality of input nodes, wherein said input circuit pulls said preset node to said second logic state when said plurality of input nodes is in any one of at least one evaluation state, and wherein said input circuit temporarily pulls said reset node to said first logic state when said plurality of input nodes transitions out of any one of said at least one evaluation state.

10. The integrated circuit of claim 9, further comprising a second device of said second conductivity type having a control terminal coupled to said output of said third inverter, having a first current terminal coupled to said reset node, and having a second current terminal receiving said second source voltage.

11. The integrated circuit of claim 9, wherein said first source voltage comprises a positive source voltage, wherein said second source voltage comprises a reference voltage, wherein said first conductivity type comprises P-type, and wherein said second conductivity type comprises N-type.

12. The integrated circuit of claim 9, wherein said first source voltage comprises a reference voltage, wherein said second source voltage comprises a positive source voltage, wherein said first conductivity type comprises N-type, and wherein said second conductivity type comprises P-type.

13. The integrated circuit of claim 9, wherein said first and second source voltages comprise a positive source voltage and a reference voltage, respectively, and wherein:
   said preset node comprises a precharge node;
   wherein said first device of said first conductivity type comprises a first P-channel device having a gate coupled to said output node, having a source receiving said positive source voltage, and having a drain coupled to said precharge node;
   wherein said first device of said second conductivity type comprises a first N-channel device having a source receiving said reference voltage, having a gate coupled to said enable node, and having a drain coupled to said reset node; and
   wherein said second device of said first conductivity type comprises a second P-channel device having a source receiving said positive source voltage, having a gate coupled to said output of said third inverter, and having a drain coupled to said precharge node.

14. The integrated circuit of claim 9, wherein the first and second source voltages comprise a reference voltage and a positive source voltage, respectively, and wherein:
   said preset node comprises a preclear node;
   wherein said first device of said first conductivity type comprises a first N-channel device having a gate coupled to said output node, having a source receiving said reference voltage, and having a drain coupled to said preclear node;
   wherein said first device of said second conductivity type comprises a first P-channel device having a source receiving said positive source voltage, having a gate coupled to said enable node, and having a drain coupled to said reset node; and
   wherein said second device of said first conductivity type comprises a second N-channel device having a source receiving said reference voltage, having a gate coupled to said output of said third inverter, and having a drain coupled to said preclear node.

15. A method of evaluating a plurality of input logic signals which include at least one return to state input signal, comprising:
   setting a preset node to a first logic state, wherein the first logic state is inverted relative to a second logic state;
   inverting the preset node to determine a logic state of an output node;
   inverting the output node to determine a logic state of an enable node;
   pulling a reset node to the second logic state when the enable node is at the first logic state;

inverting the reset node to determine a logic state of an inverted reset node;

pulling the preset node to the first logic state when the inverted reset node is at the second logic state;

forcing the preset node to the second logic state only when the plurality of input signals are in any one of at least one evaluation state, wherein the plurality of input signals includes at least one return to state input signal which returns to the second logic state after transitioning to the first logic state;

forcing the reset node to the first logic state when the enable node is in the second logic state and when the plurality of input signals transition out of an evaluation state in accordance with return to state operation; and wherein when the reset node is forced to the first logic state, the inverted reset node transitions to the second logic state, which then transitions the preset node back to the first logic state, which then transitions the output node back to the second logic state, which then transitions the enable node back to the first logic state, which then transitions the reset node back to the second logic state, which then transitions the inverted reset node back to the first logic state.

16. The method of claim 15, wherein said forcing the preset node to the second logic state comprises at least one of the at least one return to state input signal transitioning to the first logic state, and wherein said forcing the reset node to the first logic state comprises at least one of the at least one return to state input signal transitioning back to the second logic state.

17. The method of claim 15, further comprising pulling the preset node to the first logic state using a half-keeper circuit.

18. The method of claim 15, further comprising pulling the reset node to the second logic state using a half-keeper circuit.

19. The method of claim 15, wherein said setting a preset node to a first logic state comprises precharging a precharge node high to a logic one, wherein said pulling a reset node to the second logic state comprises pulling the reset node low to logic zero, wherein said pulling the preset node to the first logic state comprises pulling the precharge node high to logic one, wherein said forcing the preset node to the second logic state comprises forcing the precharge node low to logic zero, and wherein said forcing the reset node to the first logic state comprises forcing the reset node high to logic one.

20. The method of claim 15, wherein said setting a preset node to a first logic state comprises setting a preclear node low to a logic zero, wherein said pulling a reset node to the second logic state comprises pulling the reset node high to logic one, wherein said pulling the preset node to the first logic state comprises pulling the preclear node low to logic zero, wherein said forcing the preset node to the second logic state comprises forcing the preclear node high to logic one, and wherein said forcing the reset node to the first logic state comprises forcing the reset node low to logic zero.

* * * * *